(12) United States Patent
Kim et al.

(10) Patent No.: US 9,874,812 B2
(45) Date of Patent: Jan. 23, 2018

(54) METHODS OF FORMING HARDMASK MATERIAL FILM

(71) Applicants: Myeong-koo Kim, Suwon-si (KR); Nae-ry Yu, Suwon-si (KR); Won-ki Lee, Seoul (KR); Hyun-woo Kim, Seongnam-si (KR); Song-se Yi, Seoul (KR); Min-soo Kim, Seoul (KR); Jae-yeol Baek, Anyang-si (KR); Hyun-ji Song, Anyang-si (KR)

(72) Inventors: Myeong-koo Kim, Suwon-si (KR); Nae-ry Yu, Suwon-si (KR); Won-ki Lee, Seoul (KR); Hyun-woo Kim, Seongnam-si (KR); Song-se Yi, Seoul (KR); Min-soo Kim, Seoul (KR); Jae-yeol Baek, Anyang-si (KR); Hyun-ji Song, Anyang-si (KR)

(73) Assignees: SAMSUNG ELECTRONICS CO., LTD. (KR); SAMSUNG SDI CO., LTD. (KR)

(*) Notice: Subject to any disclaimer, the term of this patent is extended or adjusted under 35 U.S.C. 154(b) by 51 days.

(21) Appl. No.: 15/010,018

(22) Filed: Jan. 29, 2016

(65) Prior Publication Data
US 2016/0225636 A1  Aug. 4, 2016

(30) Foreign Application Priority Data

Jan. 30, 2015  (KR) .................. 10-2015-0015579

(51) Int. Cl.
*G03F 7/00* (2006.01)
*H01L 21/308* (2006.01)
(Continued)

(52) U.S. Cl.
CPC ...... *G03F 7/0035* (2013.01); *H01L 21/02118* (2013.01); *H01L 21/02282* (2013.01);
(Continued)

(58) Field of Classification Search
CPC .................................................. G03F 7/0035
See application file for complete search history.

(56) References Cited

U.S. PATENT DOCUMENTS 7,364,835 B2  4/2008  Bhave et al.
7,455,955 B2  11/2008  Shih et al.
(Continued)

FOREIGN PATENT DOCUMENTS

JP  07-249629  9/1995
JP  08-130199  5/1996
(Continued)

*Primary Examiner* — Kathleen Duda
(74) *Attorney, Agent, or Firm* — Myers Bigel, P.A.

(57) ABSTRACT

Methods of forming a hardmask material film are provided. The methods may include preparing a substrate including a first region that includes first patterns with a first density and a second region that includes second patterns with a second density that is lower than the first density or is free of patterns, forming a first hardmask material film in gaps between the first patterns and on surfaces of the first region and the second region, performing a heat treatment on the first hardmask material film such that solvent solubility of portions of the first hardmask material film in the gaps between the first patterns becomes different from solvent solubility of portions of the first hardmask material film outside the gaps, removing the first hardmask material film formed on the surfaces of the first region and the second region such that the portions of the first hardmask material film in the gaps at least partially remain in the gaps, and forming a second hardmask material film on the surfaces of the first region and the second region.

20 Claims, 31 Drawing Sheets

(51) Int. Cl.
*H01L 21/02* (2006.01)
*H01L 21/3105* (2006.01)
*H01L 21/311* (2006.01)

(52) U.S. Cl.
CPC .... *H01L 21/02318* (2013.01); *H01L 21/3081* (2013.01); *H01L 21/3086* (2013.01); *H01L 21/31058* (2013.01); *H01L 21/31116* (2013.01); *H01L 21/31133* (2013.01); *H01L 21/31138* (2013.01)

(56) References Cited

U.S. PATENT DOCUMENTS

| | | |
|---|---|---|
| 8,513,129 B2 | 8/2013 | Seamons et al. |
| 2009/0124076 A1 | 5/2009 | Matsui et al. |
| 2011/0291243 A1 | 12/2011 | Seamons et al. |
| 2013/0078578 A1* | 3/2013 | Iyama ............... G03F 7/325 430/296 |
| 2015/0008212 A1* | 1/2015 | Choi ............... C07C 39/14 216/41 |

FOREIGN PATENT DOCUMENTS

| | | |
|---|---|---|
| JP | 2003-209167 | 7/2003 |
| JP | 2010-170013 | 8/2010 |
| JP | 2014-165252 | 9/2014 |
| KR | 1020060126954 | 12/2006 |
| KR | 1020090000983 | 1/2009 |
| KR | 1020090081230 | 7/2009 |
| WO | WO2011149616 | 12/2011 |

* cited by examiner

US 9,874,812 B2

METHODS OF FORMING HARDMASK MATERIAL FILM

CROSS-REFERENCE TO RELATED APPLICATION

This application claims priority under 35 U.S.C. §119 to Korean Patent Application No. 10-2015-0015579, filed on Jan. 30, 2015, in the Korean Intellectual Property Office, the disclosure of which is incorporated by reference herein in its entirety.

BACKGROUND

The inventive concept relates to a method of forming a hardmask material film, and more particularly, to a method of forming a hardmask material film with improved flatness.

As semiconductor devices have been highly integrated, an area occupied by each unit cell has become smaller and an aspect ratio of patterns increases. A high aspect ratio of patterns may cause that a hardmask material film has a non-uniform thickness and a non-flat upper surface. Thus, it is difficult to accurately perform a subsequent exposure process.

SUMMARY

The inventive concept provides methods of forming a hardmask material film that form a hardmask film with considerably improved flatness without additional contamination.

A method of forming a hardmask material film may include preparing a substrate including a first region that includes first patterns with a first density and a second region that includes second patterns with a second density that is lower than the first density or is free of patterns, forming a first hardmask material film in gaps between the first patterns and on surfaces of the first region and the second region, performing a heat treatment on the first hardmask material film such that solvent solubility of portions of the first hardmask material film in the gaps between the first patterns becomes different from solvent solubility of portions of the first hardmask material film outside the gaps, removing the first hardmask material film formed on the surfaces of the first region and the second region such that the portions of the first hardmask material film in the gaps at least partially remain in the gaps, and forming a second hardmask material film on the surfaces of the first region and the second region.

In various embodiments, in the performing of the heat treatment on the first hardmask material film, heat may be transferred to the first hardmask material film through the substrate.

In various embodiments, in the performing of the heat treatment on the first hardmask material film, a heat source configured to apply heat to the substrate may be disposed on an opposite side of the first hardmask material film with respect to the substrate.

According to various embodiments, after the performing of the heat treatment on the first hardmask material film, the portions of the first hardmask material film in the gaps between the first patterns may be cured, and the portions of the first hardmask material film outside the gaps between the first patterns may not be cured.

In various embodiments, after the performing of the heat treatment on the first hardmask material film, the portions of the first hardmask material film in the gaps between the first patterns may be partially cured.

According to various embodiments, the performing of the heat treatment on the first hardmask material film may selectively cure the portions of the first hardmask material film in the gaps between the first patterns that are adjacent bottoms of the gaps.

According to various embodiments, the first hardmask material film remaining in the gaps between the first patterns of the first region may be a cured portion of the first hardmask material film.

In various embodiments, the second hardmask material film may be formed in the gaps on the cured portion of the first hardmask material.

According to various embodiments, the first hardmask material film and the second hardmask material film may be substantially a same material film.

According to various embodiments, the first patterns comprise hole patterns or line and space patterns which extend in a direction perpendicular to a surface of the substrate.

In various embodiments, an upper surface of the second hardmask material film in the first region and an upper surface of the second hardmask material film in the second region may be substantially coplanar.

According to various embodiments, immediately before the heat treatment is performed on the first hardmask material film, an upper surface the first hardmask material film in the first region and an upper surface of the first hardmask material film in the second region are not coplanar.

According to some embodiments, the upper surface of the second hardmask material film after performing the heat treatment may be more flat than an upper surface of the first hardmask material film before the heat treatment is performed on the first hardmask material film.

In various embodiments, the method may further include, after the forming of the second hardmask material film, forming a photoresist material film on the second hardmask material film, patterning the photoresist material film through a photolithography process to form photoresist patterns and patterning the second hardmask material film by using the photoresist patterns as an etching mask.

In various embodiments, the method may further include, after the forming of the second hardmask material film, performing a heat treatment on the second hardmask material film such that at least a portion of the second hardmask material film that is in the gaps between the first patterns is cured, removing the second hardmask material film from the first region and the second region such that only the cured portion of the second hardmask material film remains, and forming a third hardmask material film on the surfaces of the first region and the second region.

According to some embodiments, the third hardmask material film and the second hardmask material film may be substantially a same material film.

According to some embodiments, the first hardmask material film may include a spin-on hardmask material.

A method of forming a hardmask material film may include preparing a substrate including a first region that includes recesses and a second region that has a flat upper surface. The upper surface of the second region and an upper surface of the first region may be substantially coplanar. The method may also include forming a first hardmask material film in the recesses of the first region and on the upper surfaces of the first region and the second region such that a free surface of the first hardmask material film in the second region is higher than a free surface of the first hardmask material film in the first region, curing the first hardmask material film in the recesses of the first region, removing the first hardmask material film formed on the upper surfaces of the first region and the second region, and forming a second hardmask material film on the upper surfaces of the first region and the second region. A height difference between free surfaces of the second hardmask material film in the first region and the second region may be less than a height difference between the free surfaces of the first hardmask material film in the first region and the second region.

In various embodiments, the curing of the first hardmask material film may include applying heat to the first hardmask material film in the recesses.

According to various embodiments, the curing of the first hardmask material film may be performed at a temperature of about 80° C. to about 250° C. for about 10 seconds to about 5 minutes.

In various embodiments, the forming of the first hardmask material film may include forming the first hardmask material film on the upper surfaces of the first region and the second region through a spin coating process.

According to various embodiments, the cured first hardmask material film may remain in the recesses immediately after the removing of the first hardmask material film formed on the upper surfaces of the first region and the second region.

According to various embodiments, an upper surface of the cured first hardmask material film may be substantially coplanar with the upper surface of the first region.

According to various embodiments, the removing of the first hardmask material film may include applying a solvent, which is capable of dissolving the first hardmask material film, on the upper surfaces of the first region and the second region.

According to various embodiments, the applying of the solvent may include performing a first removal operation including dissolving and removing the first hardmask material film and performing a second removal operation including removing a residue remaining on the first hardmask material film. The first removal operation and the second removal operation are performed while rotating the substrate, and a rotational speed of the second removal operation is faster than a rotational speed of the first removal operation.

In various embodiments, the applying of the solvent may be performed for about 4 seconds to about 60 seconds.

In various embodiments, the immediately before the second hardmask material film is formed, an upper surface of the first hardmask material film remaining in the recesses may be a concave surface.

In various embodiments, a height difference between the free surfaces of the second hardmask material film in the first region and the second region may be about 50 Å or less.

In various embodiments, the forming of the first hardmask material film, the curing of the first hardmask material film, the removing of the first hardmask material film, and the forming of the second hardmask material film may be performed in a same chamber without unloading the substrate to outside of the chamber.

According to various embodiments, the removing of the first hardmask material film may be performed until the flat upper surface of the second region is exposed.

A method of improving flatness of a material film may include preparing a substrate including a first region and a second region which have different topologies, forming a first hardmask material film on the first region and the second region, selectively curing a portion of the first hardmask material film formed on the first region, removing a portion of the first hardmask material film that is not cured, and forming a second hardmask material film on the first region and the second region.

The first hardmask material film and the second hardmask material film may be substantially a same material film.

According to various embodiments, a height difference between upper surfaces of the first hardmask material film in the first region and the second region may be smaller than a height difference between upper surfaces of the second hardmask material film in the first region and the second region.

A method of forming a mask layer may include forming a first mask material on a substrate that includes recesses in a surface. The first mask material may be formed in the recesses. The method may also include selectively curing portions of the first mask material that are in the recesses, removing non-cured portions of the first mask material from the substrate and forming a second mask material on the surface of substrate that includes the cured portions of the first mask material.

According to various embodiments, the surface may be a first surface, and the substrate may include a second surface opposite the first surface. Selectively curing the portions of the first mask material may include applying heat to the second surface of the substrate.

In various embodiments, removing the non-cured portions of the first mask material comprises performing a rinse process using a solvent.

In various embodiments, the cured portions of the first mask material and the non-cured portions of the first mask material may have different solubility in the solvent.

According to various embodiments, removing the non-cured portions of the first mask material comprises performing the rinse process until the surface of the substrate is exposed.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
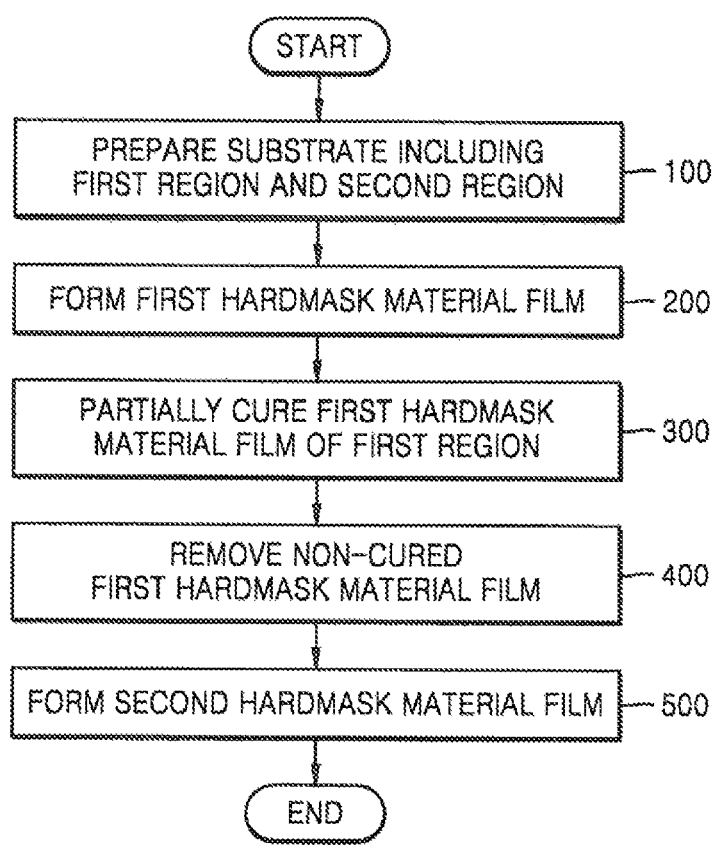
FIG. 1 is a flowchart of a method of forming a hardmask material film, according to some embodiments of the inventive concept.

Hereinafter, example embodiments of the inventive concept will be described in detail with reference to the accompanying drawings. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. Like reference numerals in the drawings denote like elements, and thus their description will be omitted. Furthermore, various elements and regions are schematically illustrated in the drawings. Therefore, the inventive concept is limited to the relative sizes or intervals illustrated in the accompanying drawings. As used herein, the term "and/or" includes any and all combinations of one or more of the associated listed items It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart of a method of forming a hardmask material film, according to some embodiments of the inventive concept. FIGS. 2A to 2H are cross-sectional views illustrating intermediate structures provided in operations of a method of forming a hardmask material film, according to some embodiments of the inventive concept.

Figure 2A:
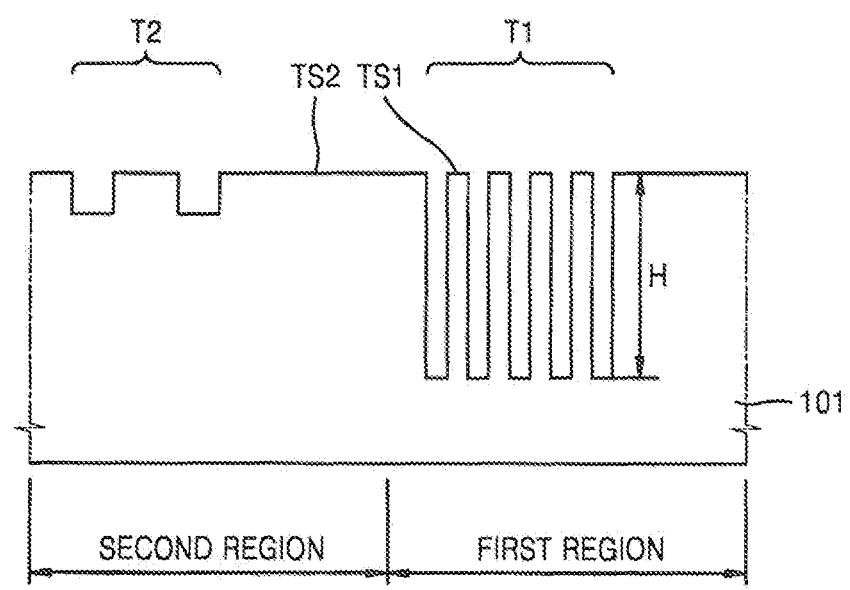
FIGS. 2A to 2H are cross-sectional views illustrating intermediate structures provided in operations of a method of forming a hardmask material film, according to some embodiments of the inventive concept.

Referring to FIGS. 1 and 2A, a substrate 101 having topology patterns may be provided (Block 100). It will be understood that "topology patterns" can be used interchangeably with "pattern."

The substrate 101 may be a semiconductor substrate. In some embodiments, the substrate 101 may include semiconductor material such as silicon (Si) or germanium (Ge). In some embodiments, the substrate 101 may include a compound semiconductor such as SiGe, SiC, GaAs, InAs, or InP. In some embodiments, the substrate 101 may have a silicon on insulator (SOI) structure. The substrate 101 may include a conductive region, for example, an impurity-doped well or an impurity-doped structure. In addition, the substrate 101 may have various device isolation structures such as a shallow trench isolation (STI) structure.

Semiconductor devices, such as transistors or diodes, may be formed on the substrate 101. A plurality of wirings may be arranged on the substrate 101 in a multilayer structure and be electrically separated from one another by an interlayer insulating film.

In some embodiments, the substrate 101 may be an insulating film or a conductive film. For example, the substrate 101 may include metal, alloy, metal carbide, metal nitride, metal oxynitride, metal oxycarbide, a semiconductor, polysilicon, oxide, nitride, oxynitride a hydrocarbon compound, or any combinations thereof, but is not limited thereto.

The substrate 101 may include a first region and a second region, which have different topologies.

First topology patterns T1 may be formed in the first region. The first topology patterns T1 may have regularly repeating patterns. In some embodiments, the first topology patterns T1 may have irregular patterns. The first topology patterns T1 may be, for example, recesses. In some embodiments, the first topology patterns T1 may be, for example, line and space patterns or hole patterns. The hole patterns may include holes having a predetermined depth H in a direction vertical to upper surfaces TS1 and TS2 of the substrate 101.

Second topology patterns T2 may be formed in the second region. The second topology patterns T2 may have regularly repeating patterns. In some embodiments, the second topology patterns T2 may have irregular patterns. The second topology patterns T2 may be, for example, recesses. In some embodiments, the second topology patterns T2 may be, for example, line and space patterns or hole patterns. The hole patterns may include holes having a predetermined depth in a direction vertical to the upper surfaces TS1 and TS2 of the substrate 101. However, the inventive concept is not limited thereto.

In some embodiments, no topology patterns may be formed in the second region such that the second region may have a flat upper surface TS2.

The upper surface TS1 of the first region may be at substantially the same height as the upper surface TS2 of the second region. In some embodiments, the upper surface TS1 of the first region and the upper surface TS2 of the second region may be substantially coplanar as illustrated in FIG. 2A.

When the second topology patterns T2 are formed in the second region, the first topology patterns T1 formed in the first region may be denser than the second topology patterns T2 formed in the second region, it will be understood that the term "denser" used herein means that the repetition period of the patterns is shorter, or the number of patterns per unit area is larger. That is, as illustrated in FIG. 2A, the repetition period of the first topology patterns T1 in the first region is shorter than the repetition period of the second topology patterns T2 in the second region. Accordingly, it will be understood that the first topology patterns T1 are denser than the second topology patterns T2.

For example, the first region may be a cell region of a memory device, and the second region may be a core/ peripheral region of the memory device. However, the inventive concept is not limited thereto.

Figure 2B:
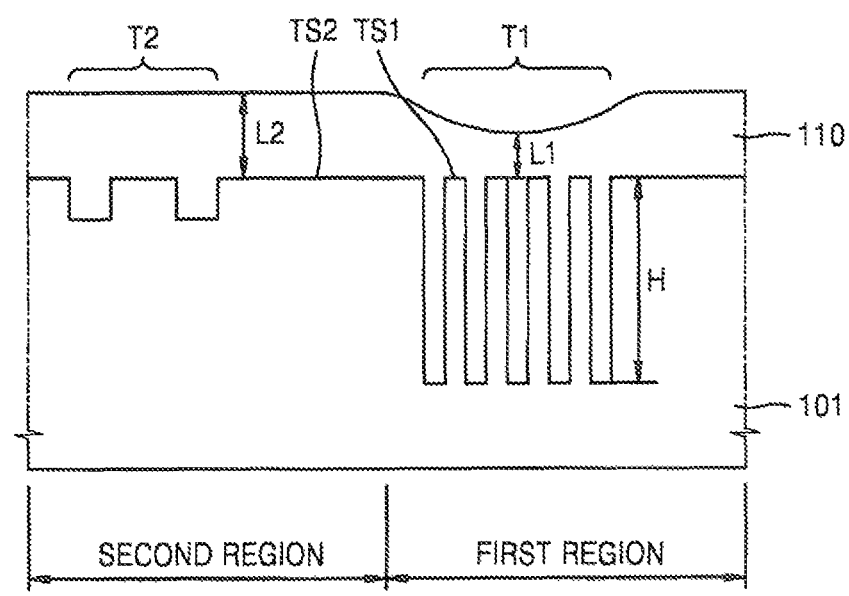

Referring to FIGS. 1 and 2B, a first hardmask material film 110 is formed on the upper surfaces TS1 and TS2 of the first region and the second region (Block 200).

The first hardmask material film 110 may be formed by using, for example, a dip coating process, a solution casting process, or a spin coating process. However, the inventive concept is not limited thereto.

The first hardmask material film 110 may be cured by applying energy thereto. Before the first hardmask material film 110 is cured, the first hardmask material film 110 may be easily dissolved in a solvent and exist in a liquid phase having an appropriate viscosity. However, after the first hardmask material film 110 is cured, the first hardmask material film 110 may have a predetermined solvent resistance and a predetermined etching characteristic. Furthermore, the first hardmask material film 110 may be a material that is easily removed by heating under the presence of oxygen using a process, for example, an ashing process.

For example, the first hardmask material film 110 may include a carbon-based material. For example, the first hardmask material film 110 may include a hydrocarbon compound having an aromatic repeating unit. For example, the first hardmask material film 110 may include a so-called spin-on hardmask solution and may include a monomer, a cross-linking agent, and a solvent.

Examples of the monomer may include a pyrene derivative, a naphthalene derivative, an anthracene derivative, a phenanthrene derivative, a fluorine derivative, a phthalic anhydride derivative, a naphthacene derivative, a fluoanthracene derivative, a tetraphene derivative, a perylene derivative, a ehrysene derivative, a dibenzoanthracene derivative, a pentaphene derivative, a coronene derivative, a pentacene derivative, a hexacene derivative, an antanthrene derivative, an ovalene derivative, a pyranthrene derivative, an acenaphthene derivative, an acenaphthylene derivative, a fluoranthene derivative, a fluoranthene derivative, and a triphenylene derivative.

The cross-linking agent may include an isocyanate-based cross-linking agent, a peroxide-based cross-linking agent, an epoxy-based cross-linking agent, and/or an amine-based cross-linking agent.

Examples of compounds related to the isocyanate-based cross-linking agent may include isocyanate monomers, such as tolylene diisocyanate, chlorphenylene diisocyanate, tetramethylene diisocyanate, xylylene diisocyanate, diphenylmethane diisocyanate, and hydrogenated diphenylmethane diisocyanate; adduct-type isocyanate compounds prepared by additional reaction of these isocyanate monomers and trimethylolpropane; isocyanurate compounds; burette-type compounds; and urethane prepolymer-type isocyanate prepared by additional reaction of polyether polyol, polyester polyol, acrylic polyol, polybutadiene polyol, or polyisoprene polyol. In particular, the examples of the compounds may include a polyisocyanate compound and may include one selected from the group consisting of hexamethylene diisocyanate, hydrogenated xylylene diisocyanate, and isophorone diisocyanate, or a polyisocyanate compound derived therefrom.

Examples of the peroxide-based cross linking agent may include di(2-ethylhexyl)peroxy dicarbonate, di(4-t-butylcyclohexyl)peroxy dicarbonate, di-sec-butylperoxy dicarbonate, t-butylperoxy neodecanoate, t-hexylperoxy pivalate, t-butylperoxy pivalate, dilauroyl peroxide, di-n-octanoyl peroxide, 1,1,3,3-tetramethylbutylperoxy-2-ethylhexanoate, di(4-methylbenzoyl)peroxide, dibenzoyl peroxide, t-butylperoxy isobutyrate, and 1,1-di(t-hexylperoxy)cyclohexane.

Examples of the epoxy-based cross-linking agent may include N,N,N',N'-tetraglycidyl-m-xylenediamine, diglycidyl aniline, 1,3-bis(N,N-diglycidyl aminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglyceral polyglycidyl ether, sorbitan polyglycidyl ether, trimethylolpropane polyglycidyl ether, adipate diglycidyl ester, o-phthalic acid diglycidyl ester, triglycidyl-tris(2-hydroxyethyl)isocyanurate, resorcin diglycidyl ether, and bisphenol-S-diglycidyl ether.

Examples of the amine-based cross-linking agent may include a compound having a plurality of amino groups, such as ethylenediamines. Specifically, examples of the ethylenediamines may include ethylenediamine, 1,2-diaminopropane, 1,2-diamino-2-methylpropane, N-methyl-ethylenediamine, N-ethyl-ethylenediamine, N-isopropyl-ethylenediamine, N-cyclohexyl-ethylenediamine, N-cyclohexyl-ethylenediamine, N-octyl-ethylenediamine, N-decyl-ethylenediamine, N-dodecyl-ethylenediamine, N,N-dimethyl-ethylenediamine, N,N-diethyl-ethylenediamine, N,N'-diethyl-ethylenediamine, N,N'-diisopropyl ethylenediamine, N,N,N'-trimethyl-ethylenediamine, diethylenetriamine, N-isopropyl-diethylenetriamine, N-(2-aminoethyl)-1,3-propanediamine, triethylenetetramine, N,N'-bis(3-aminopropyl)ethylenediamine, N,N'-bis(2-aminoethyl)-1,3-propanediamine, tris(2-aminoethyl)amine, tetraethylenepentamine, pentaethylene hexamine, 2-(2-amino-ethylamino)ethanol, N,N-bis(hydroxyethyl)ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, and polyethyleneimine. In addition to the ethylenediamines, examples of the diarnines and polyamines may include 1,3-diaminopropane, 1,4-diaminobutane, 1,3-diaminopentane and 1,5-diminopemane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyl-dipropylamine, N-(3-aminopropyl)-1,3-propanediamine, spermidine, bis(hexamethylene)triamine, N,N',N'''-trimethyl-bis(hexamethylene)triamine, 4-amino-1,8-octanediamine, N,N'-bis(3-aminopropyl)-1,3-propiediamine, spermine, 4,4'-methylenebis(cyclohexylamine), 1,2-diaminocyclohexane, 1,4-diaminocyclohexane, 1,3-cyclohexane bis(methylamine), 1,4-cyclohexane bis(methylamine), 1,2-bis(aminoethoxy)ethane, 4,9-dioxa-1,12-dodecanediamine, 4,7,10-trioxa-1,13-tridecanediamine, 1,3-diamino-hydroxy-propane, 4,4-methylene dipiperidine, 4-(aminomethyl)piperidine, 3-(4-aminobutyl)piperidine, and polyallylamine, but inventive concept is not limited thereto.

The solvent may include propylene glycol monomethyl ether acetate (PGMEA), propylene glycol monomethyl ether (PGME), propylene glycol propyl ether (PGPE), cyclohexanone, N-methyl-2-pyrrolidone (NMP), γ-butyrolactone (GBL), 2-hydroxyisobutyric acid methylester (HBM), dimethyl sulfoxide (DMSO), and/or ethyl lactate (EL).

The first hardmask material film 110 may include a solution prepared by mixing the monomer, the cross-linking agent, and the solvent, but is not limited thereto.

When the first hardmask material film 110 is formed on the first region and the second region, the first hardmask material film 110 may be formed in the recesses between the first topology patterns T1. In some embodiments, the first hardmask material film 110 may fill the recesses between the first topology patterns T1. The filling of the recesses with the first hardmask material film 110 may be performed by a capillary phenomenon caused by a narrow gap between the first topology patterns T1.

After the first hardmask material film 110 is formed, an upper surface of the first hardmask material film 110 may not have the same level (e.g., height) at all positions of the substrate 101. That is, a level L1 of the upper surface of the first hardmask material film 110 in the first region may be different from a level L2 on the upper surface of the first hardmask material film 110 in the second region.

More specifically, the upper surface of the first hardmask material film 110 may have a lower level in the first region than in the second region as illustrated in FIG. 2B. The upper surface of the first hardmask material film 110 may not have the same level due to a different density of the patterns formed under the first hardmask material film 110.

It will be understood that if the first hardmask material film 110 illustrated in FIG. 2B is cured and then is patterned through a photolithography process, an exposure process may be unsatisfactorily performed due to the level difference (L2−L1) of the upper surfaces of the first hardmask material film 110.

Figure 2C:
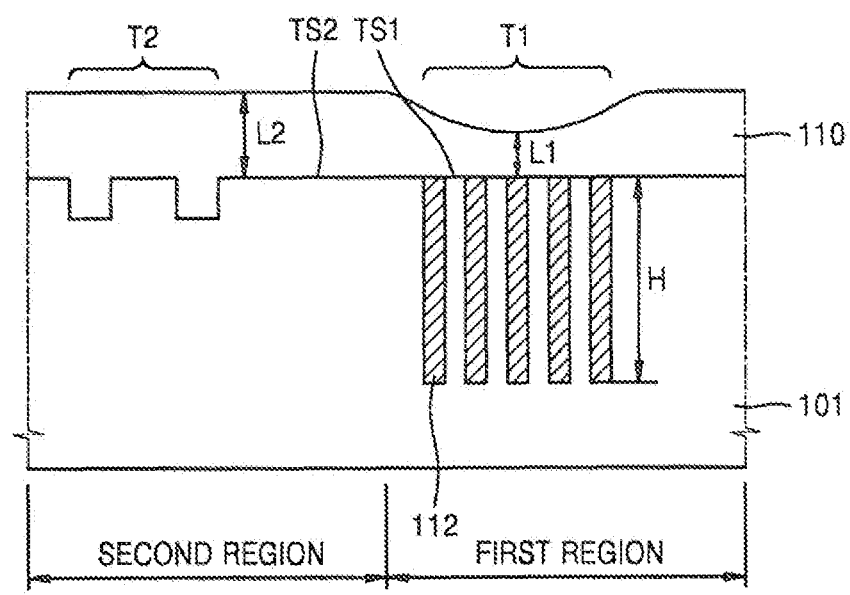

Referring to FIGS. 1 and 2C, the first hardmask material film 110 may be partially (i.e., selectively) cured (Block 300). A curing condition may be adjusted so that a first hardmask material film 112 between the first topology patterns T1 is partially (i.e., selectively) cured and the first hardmask material film 110 not between the first topology patterns T1 is not cured.

Figure 3:
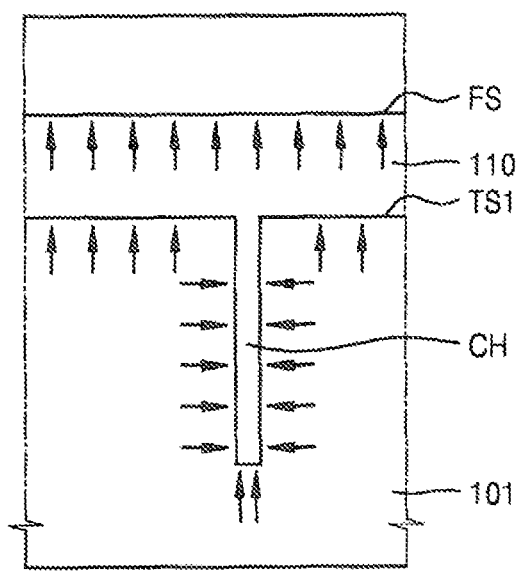
FIG. 3 is a view for describing a partial curing of a first hardmask material film.

The first hardmask material film 110 may be cured by applying energy thereto. In some embodiments, the first hardmask material film 110 may be cured by applying heat energy thereto so as to polymerize hydrocarbon monomers. FIG. 3 is a view for describing the partial curing of the first hardmask material film 110.

Referring to FIG. 3, in order to perform a heat treatment, heat energy may be applied to the substrate 101 from a lower side of a chamber. For example, a heat source for the heat treatment may be provided in a stage or a chuck on which the substrate 101 is placed. Heat generated from the heat source may be transferred to a lower surface of the substrate 101 through the stage or the chuck and be then transferred upward through conduction. That is, the heat source, which applies heat to the substrate 101, may be disposed on an opposite side of the hardmask material film 110 with respect to the substrate 101.

In a region in which the first topology patterns T1 are not formed, heat is transferred toward the upper surface TS1 of the substrate 101 while having an isothermal profile. The heat transferred to the upper surface TS1 of the substrate 101 may be transferred to the first hardmask material film 110 formed on the upper surface TS1 of the substrate 101, be transferred to a free surface FS of the first hardmask material film 110, and be then transferred to the atmosphere.

Heat is transferred toward a center of a space (e.g., a contact hole CH of FIG. 3) between the first topology patterns T1. The heat, which is transferred toward the center of the contact hole CH, may continuously accumulate in the contact hole CH and be used as energy for polymerizing the first hardmask material film 110. Accordingly, the first hardmask material film 110 may be cured in the contact hole CH before the upper portion of the upper surface TS1 is cured.

Furthermore, even when a temperature of the atmosphere above the free surface FS of the first hardmask material film 110 is slightly high, a heat transfer coefficient between the substrate 101 and the first hardmask material film 110 is much greater than a heat transfer coefficient between the atmosphere and the first hardmask material film 110. Thus, a heat transfer rate from the substrate 101 to the first hardmask material film 110 is much greater than a heat transfer rate from the atmosphere to the first hardmask material film 110. Therefore, energy build-up is much faster in the first hardmask material film 110 inside the contact hole CH than in the first hardmask material film 110 on the upper surface TS1 of the substrate 101. Hence, the curing according to polymerization occurs earlier in the first hardmask material film 110 inside the contact hole CH than in the first hardmask material film 110 on the upper surface TS1 of the substrate 101.

Referring again to FIG. 2C, while the first hardmask material film 112 between the first topology patterns T1 is cured to a solid state, the first hardmask material film 110 existing on the upper surfaces TS1 and TS2 of the first and second regions may be maintained in a non-cured state. In other words, the first hardmask material film 110, on the upper surface TS1 of the first region and the upper surface TS2 of the second region, may be maintained in a liquid state, or may be weakly polymerized to slightly increase viscosity thereof. In addition, the first hardmask material film 110 in the second region may be locally cured according to the dimension and shape of the second topology patterns T2.

The first hardmask material film 110, which is in the liquid state, may be easily removed by a solvent, but the cured first hardmask material film 112 may not be easily removed by a solvent. That is, the cured first hardmask material film 112 has solubility different from the non-cured first hardmask material film 110.

As described above, the heat treatment condition that causes differences in the curing degree and the solubility with respect to the solvent may be empirically determined through trial and error. For example, the heat treatment may be performed at a temperature of about 80° C. to about 250° C. for about 10 seconds to about 5 minutes. In some embodiments, the heat treatment may be performed at a temperature of about 120° C. to about 160° C. for about 15 seconds to about 1 minute. However, the heat treatment condition may vary depending on dimensions and densities of the topology patterns, materials of the first hardmask material film 110, materials of the substrate 101, or the like.

When the heat treatment is performed at a higher temperature than the empirically determined temperature and/or for a longer time than the empirically determined time, the first hardmask material film 110 on the upper surfaces TS1 and TS2 may also be cured. Hence, the curing process may be stopped before then.

Figure 2D:
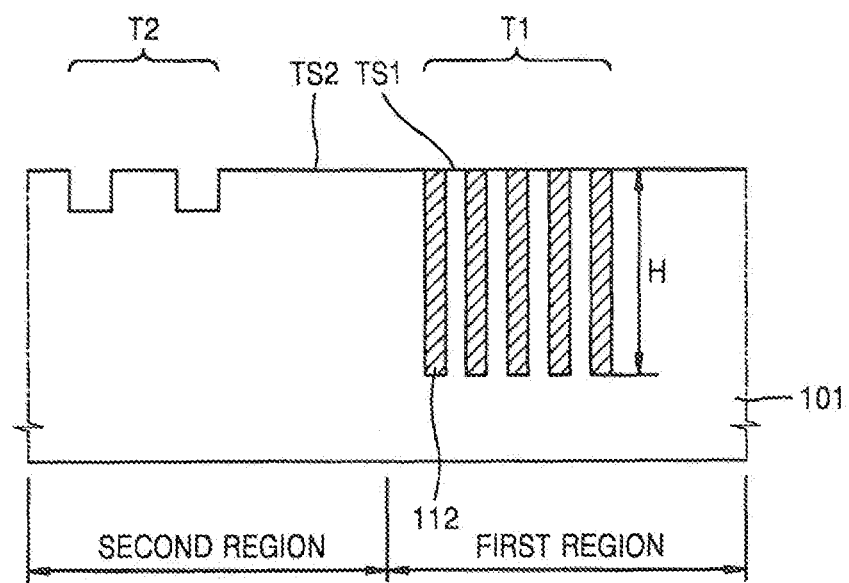

Referring to FIGS. 1 and 2D, the non-cured first hardmask material film 110 may be removed from the first region and the second region (Block 400).

In order to remove the non-cured first hardmask material film 110, a rinse process may be performed by using a solvent. Examples of the solvent for the rinse process may propylene glycol monomethyl ether acetate (PGMEA), ethyl ethoxypropionate (EEP), methyl hydroxyisobutyrate (HBM), propylene glycol monomethyl ether (PGME), propylene glycol propyl ether (PGPE), cyclohexanone, N-methyl-2-pyrrolidone (NMP), γ-butyrolactone (GBL), 2-hydroxyisobutyric acid methylester (HBM), dimethyl sulfoxide (DMSO), and/or ethyl lactate (EL).

The solvent may be an appropriate mixture of a protic solvent and an aprotic solvent. In some embodiments, the solvent may be a mixture of ethyl ethoxypropionate and γ-butyrolactone, which are the aprotic solvent, and ethyl lactate, which is the protic solvent. In some embodiments, the solvent may be a mixture of propylene glycol monomethyl ether acetate (PGMEA), which is the aprotic solvent, and ethyl lactate and methyl hydroxyisobutyrate (HBM), which are the protic solvent. However, the inventive concept is not limited thereto.

In order to remove the non-cured first hardmask material film 110 by using the solvent, the solvent may be supplied on the non-cured first hardmask material film 110 while rotating the substrate 101. The solvent may dissolve and remove the non-cured first hardmask material film 110 while flowing in a radial direction of the substrate 101 by a centrifugal force. In other words, the solvent may remove the non-cured first hardmask material film 110 while flowing through the entire surfaces of the first region and the second region. The solvent may be supplied to the upper surface of the substrate 101, for example, for about 4 seconds to about 60 seconds.

The rinse process may be performed until the flat upper surface TS2 of the second region is exposed. Therefore, the first hardmask material film 110 existing in the second topology patterns T2 may not be completely removed. In some embodiments, the first hardmask material film 110 existing in the second topology patterns 12 may be completely removed. In some embodiments, the rinse process may be ended in such a state that a portion of the first hardmask material film 110 is left in the second topology patterns T2.

The rinse process may be performed through two or more operations. That is, the rinse process may include a first removal operation of dissolving and removing the first hardmask material film 110 by using a solvent while rotating the substrate 101 at a first rotational speed and a second removal operation of removing the first hardmask material film 110 remaining on the surface of the substrate 101 while rotating the substrate 101 at a second rotational speed. In some embodiments, the first rotational speed may be faster than the second rotational speed. For example, the first rotational speed may be several hundred revolutions per minute (RPM), and the second rotational speed may be about 1,000 RPM to about 2,000 RPM.

When the rinse process is performed through the two operations, the unnecessary first hardmask material film 110 on the upper surfaces TS1 and TS2 of the first and second regions may be completely removed, thus obtaining a more excellent flatness in a subsequent process.

As described above, even after the non-cured first hardmask material film 110 is removed, the cured first hardmask material film 112 may remain in the first topology patterns T1, without being removed.

Figure 2E:
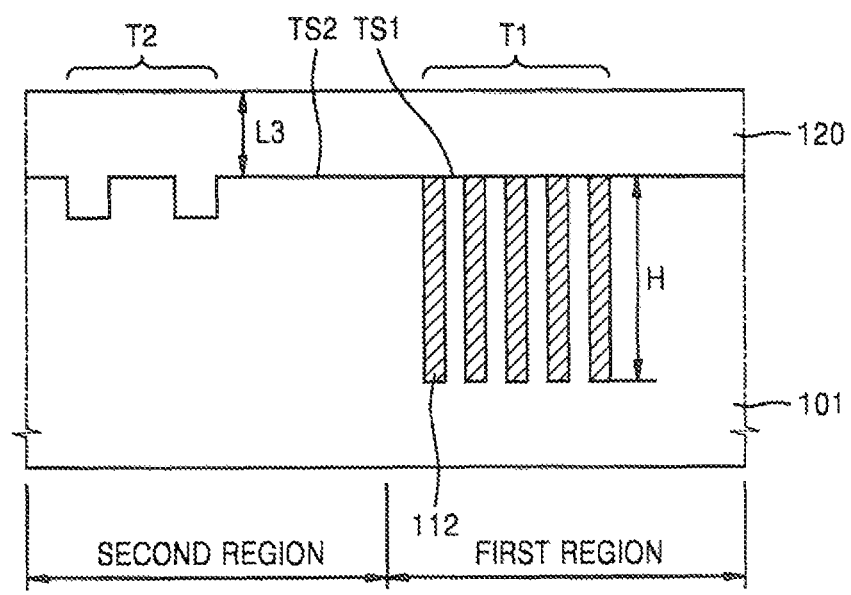

Referring to FIGS. 1 and 2E, a second hardmask material film 120 may be formed to cover the upper surfaces of the first region and the second region. Since the first topology patterns T1 are buried by the cured first hardmask material film 112, there is no height difference between upper surfaces of the second hardmask material film 120 in the first region and the second region, or the height difference is significantly reduced as illustrated in FIG. 2E. It will be understood that "an element A covers an element B" means that the element A is on the element B and does not necessarily mean that the element A covers an entire portion of the element B.

For example, the height difference between the upper surfaces of the second hardmask material film 120 in the first region and the second region may be about 50 Å or less, which is optically negligible in a subsequent photolithography exposure process.

The second hardmask material film 120 may be substantially the same material film as the first hardmask material film 110. In this case, after the second hardmask material film 120 is cured through baking, an interface between a second hardmask material film 122 (see FIG. 2F) and the cured first hardmask material film 112 may not be identified (i.e., not visible).

In some embodiments, the second hardmask material film 120 may be a different material film from the first hardmask material film 110. In this case, the first hardmask material film 110 may include a material more suitable for partial (i.e., selective) curing, and the second hardmask material film 120 may include a material having more excellent characteristics, such as etching selectivity, as a hardmask.

Figure 2F:
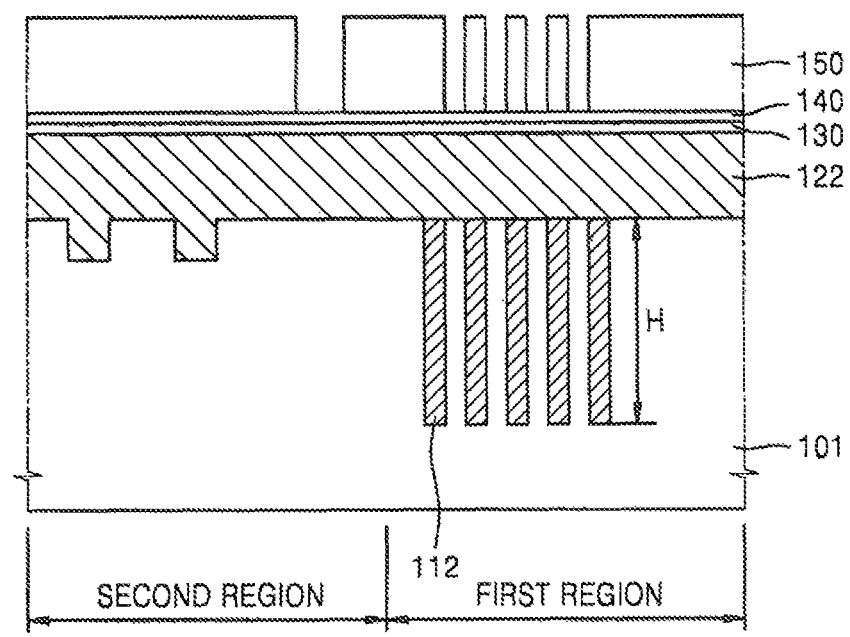

Referring to FIG. 2F, the second hardmask material film 120 is cured to obtain the cured second hardmask material film 122. In order to obtain the cured second hardmask material film 122, energy may be applied to the second hardmask material film 120. The energy may be optical energy or thermal energy.

A silicon oxynitride film 130 may be formed on the cured second hardmask material film 122. The silicon oxynitride film 130 may function as a hardmask to transfer patterns onto the second hardmask material film 122 disposed thereunder. In addition, the silicon oxynitride film 130 may assist an anti-reflection film 140 disposed thereon to function as an anti-reflection film in an exposure process.

The silicon oxynitride film 130 may be formed through, for example, a spin coating process, and may be formed to have a thickness of about 20 nm to about 100 nm. In addition, in order to remove the solvent, the silicon oxynitride film 130 may be cured at a temperature of about 200° C. to about 250° C.

The anti-reflection film 140 may be formed on the silicon oxynitride film 130.

The anti-reflection film 140 may reduce or possibly prevent total reflection of light in a subsequent exposure process. As a material of the anti-reflection film 140, any material may be used as long as the material is usable in a common photolithography process. In some embodiments, the anti-reflection film 140 may include an organic anti-reflective coating (ARC) material for a KrF excimer laser, an ArF excimer laser, or any other light source. The anti-reflection film 140 may include an ARC material used in a dry lithography process or an ARC material used in an immersion lithography process. For example, the anti-reflection film 140 may include at least one ARC material selected from among an "NCA" series and an "NCST" series (manufactured by Nissan Chemical Industries, Ltd.), an "XP" series (manufactured by Rohm and Haas Electronic Materials (RHEM)), and an "SNSA" series (manufactured by Shin-Etsu Chemical Co.).

In some embodiments, the anti-reflection film 140 may be an inorganic anti-reflection film or an organic anti-reflection film. Examples of the inorganic anti-reflection film may include titanium, titanium dioxide, titanium nitride, chromium oxide, carbon, silicon nitride, silicon oxynitride, amorphous silicon, and any combinations thereof. Examples of the organic anti-reflection film may include a material containing a condensate of a diphenylamine derivative and a formaldehyde modified melamine resin, an alkali-soluble resin, and a light-absorbing agent, as described in JP1995-69611B (JP-H07-69611B); a reactant of a maleic anhydride copolymer and a diamine-type light-absorbing agent, as described in U.S. Pat. No. 5,294,680A; a material containing a resin binder and a methylol melamine-based heat cross-linking agent, as described in JP1994-118631A (JP-H06-118631A); an acrylic resin-type anti-reflection film having a carboxylic acid group, an epoxy group, and a light-absorbing group in the same molecule, as described in JP1994-118656A (JP-H06-118656A); a material containing methylol melamine and a benzophenone-based light-absorbing agent, as described in JP1996-87115A (JP-H08-87115A); and a material in which a low-molecular-weight light-absorbing agent is added to a polyvinyl alcohol resin, as described in JP1996-179509A (JP-H08-179509A). In addition, examples of the organic anti-reflection film may include commercially available organic anti-reflection films such as a DUV30 series and a DUV-40 series (manufactured by Brewer Science, Inc.) and AR-2, AR-3, and AR-5 (manufactured by Shipley Co., Ltd.).

Photoresist patterns 150 may be formed on the anti-reflection film 140. In order to form the photoresist patterns 150, a photoresist film is formed by coating a photoresist composite including a photosensitive polymer, a potential acid, a solvent, and the like on the anti-reflection film 140, and then, an exposure process and a development process may be performed on the photoresist film. The coating of the photoresist composite may be performed by using a spin coating process, a spray coating process, or a deep coating process.

The photoresist patterns 150 may include a positive photoresist material. The photoresist patterns 150 may include a polymer, a polarity of which is increased by the action of an acid. For example, the photoresist patterns 150 may include a polymer containing an acid-labile protecting, group and a chemical amplification-type photoresist containing a potential acid.

In some embodiments, the photoresist film may include a resist for a KrF excimer laser (248 nm), a resist for an ArF excimer laser (193 nm), a resist for an F2 excimer laser (157 nm), or a resist for extreme ultraviolet (EUV) light (13.5 nm).

For example, the photoresist patterns 150 may include a (meth)acrylate-based polymer. The (meth)acrylate-based polymer may be an aliphatic(meth)acrylate-based polymer. Examples of the (meth)acrylate-based polymer may include polymethyl methacrylate (PMMA), poly(t-butyl methacrylate), poly(methacrylic acid), poly(norbornyl methacrylate), a binary or ternary copolymer of repeating units of the (meth)acrylate-based polymers, and any combinations thereof. In addition, the above-described polymers may be substituted with various acid-labile protecting groups. The acid-liable protecting group may include tert-butoxycarbonyl (t-BOC), isonorbonyl, 2-methyl-2-adamantyl, 2-ethyl-2-adamantyl, 3-tetrahydrofuranyl, 3-oxocyclohexyl, γ-butyllactone-3-yl, mevalonic lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxy-ethyl, 1-ethoxyethyl, 1-(2-methoxyethoxy)ethyl, 1-(2-acetoxyethoxy)ethyl, t-butoxycarbonylmethyl, methoxymethyl, ethoxymethyl, trimethoxysilyl, and/or triethoxysilyl, but is not limited thereto.

In some embodiments, the potential acid may include photoacid generator (PAG), thermoacid generator (TAG), and/or any combinations thereof. In some embodiments, the PAG may include a material generating an acid when exposed to light selected from among EUV light (1 nm to 13.5 nm), an F2 excimer laser (157 nm), an ArF excimer laser (193 nm), and a KrF excimer laser (248 nm). The PAG may include an onium salt, a halogen compound, nitrobenzyl esters, alkyl sulfonates, diazonaphthoquinones, iminosulfonates, disulfones, diazomethanes, and/or sulfonyloxy ketones.

In order to form the photoresist patterns 150, after the photoresist composite is coated on the anti-reflection film 140, a soft bake process may be performed at a temperature of about 90° C. to about 120° C. for about 30 seconds to about 5 minutes.

A portion of the photoresist film is exposed to form an exposed photoresist film having a non-exposed region and an exposed region including acids.

The exposure process may be performed by using EUV light, an F2 excimer laser (157 nm), an ArF excimer laser (193 nm), or a KrF excimer laser (248 nm). When forming fine patterns from the photoresist film, for example, when forming a plurality of line and space patterns having a width of several tens of nm, an EUV lithography process using EUV light may be used. The EUV lithography process may be performed by using light having a wavelength of an x-ray region or a vacuum ultraviolet region, for example, light having a wavelength of about 10 nm to about 20 nm, specifically about 13.5 nm to about 0.3 nm. When the exposure process is performed by using EUV light, a reflective optical system including a reflective photomask and mirrors may be used. As a result of exposing the photoresist film, acids generated from the PAG and/or the TAG may exist in the exposed region of the exposed photoresist film.

A post exposure baking process (PEB) may be performed on the exposed photoresist film. The acids in the exposed region may be diffused to a bottom surface of the exposed region through the PEB process. In some embodiments, the PEB process may be performed at a temperature of about 70° C. to about 150° C. for about 30 seconds to about 120 seconds.

The exposed photoresist film may be developed to form the photoresist patterns 150. The development process may be performed by using an alkaline aqueous solution. For example, the development process may be performed by using 2.38 wt % of a tetramethylammonium hydroxide (TMAH) aqueous solution.

Figure 2G:
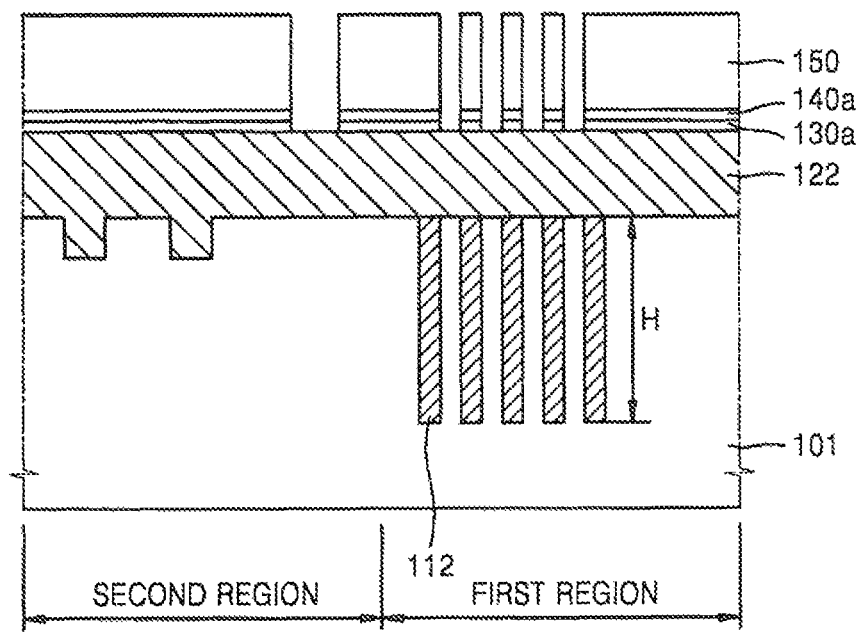

Referring to FIG. 2G, the anti-reflection film 140 may be patterned by using the photoresist patterns 150 as an etching mask. When an organic anti-reflection film is used as the anti-reflection film 140, a patterning process of removing an exposed portion of the anti-reflection film 140 may be performed by an ashing process using $O_2$ as an etchant.

After the anti-reflection film 140 is patterned, the silicon oxynitride film 130 may be patterned by using anti-reflection patterns 140a as an etching mask. The silicon oxynitride film 130 may be patterned by using a $C_xF_y$ gas or a $CH_xF_y$ gas as a main etching gas (where x and y are integers from 1 to 10). In some embodiments, the silicon oxynitride film 130 may be patterned by using a mixture of the main etching gas and at least one selected from an $O_2$ gas and an Ar gas. Examples of the $C_xF_y$ gas may include of $C_3F_6$, $C_4F_6$, $C_4F_8$, and $C_5F_8$.

Examples of $CH_xF_y$ may include $CHF_3$ or $CH_2F_2$. The $O_2$ gas, which is added to the etching gas, may function to remove a polymer by-product generated during the etching process and decompose the $C_xF_y$ etching gas. In addition, the Ar gas, which is added to the etching gas, may be used as a carrier gas and may cause an ion bombardment. In etching the silicon oxynitride film 130, plasma may be generated from an etching gas selected from the above-described etching gases in an etching chamber, and thus, the etching process may be performed in a plasma atmosphere. In some embodiments, the etching process may be performed in the selected etching gas atmosphere having no ion energy, without generating plasma in the etching chamber. For example, in order to etch the silicon oxynitride film 130, a mixture gas of $C_4F_6$, $CHF_3$, $O_2$, and Ar may be used as an etching gas. In this case, while gases are supplied so that a volume ratio of $C_4F_6$:$CHF_3$:$O_2$: Ar is about 1:6:2:14, a dry etching process may be performed at a pressure of about 30 mT for several seconds to several ten seconds.

Figure 2H:
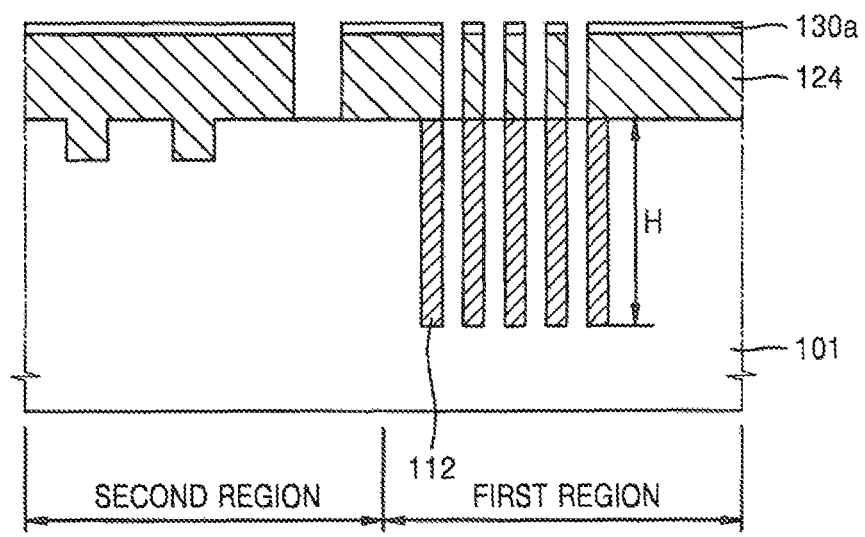

Referring to FIG. 2H, the photoresist patterns 150 and the anti-reflection film 140a may be removed and the second hardmask material film 122 may be patterned by using a silicon oxynitride film 130a as an etching mask to thereby obtain a hardmask 124. As in the case of using the organic anti-reflection film, the exposed region of the second hardmask material film 122 may be patterned by the ashing process using $O_2$ as an etchant.

Figure 4:
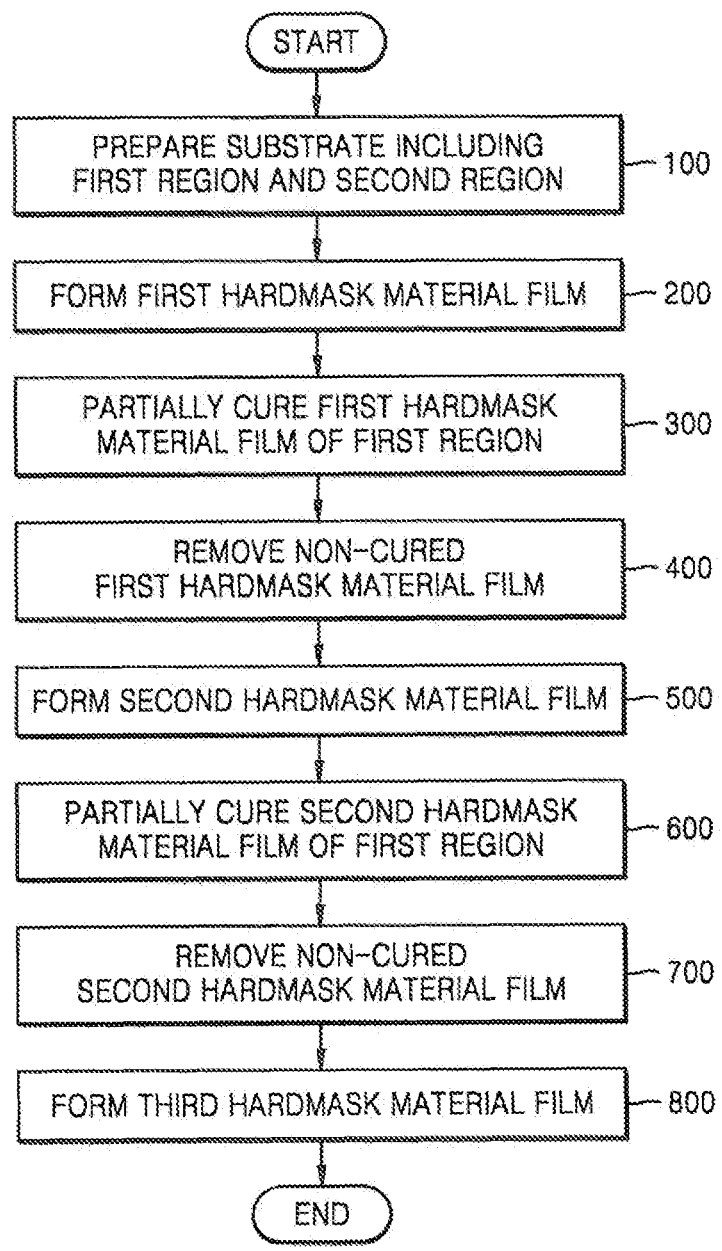
FIG. 4 is a flowchart of a method of forming a hardmask material film, according to some embodiments of the inventive concept.

FIG. 4 is a flowchart of a method of forming a hardmask material film, according to some embodiments of the inventive concept. FIGS. 5A to 5G are cross-sectional views illustrating intermediate structures provided in operations of a method of forming a hardmask material film, according to some embodiments of the inventive concept.

Referring to FIG. 4, a substrate 101 including a first region and a second region may be provided (Block 100). A first hardmask material film 110 may be formed in the first region and the second region (Block 200). First topology patterns T1 comprising recesses may be formed in the first region and the second region may have a flat surface. In addition, the first hardmask material film 110 may be formed so that a free surface is at a higher level (e.g., height) in the second region than in the first region.

Since the above descriptions have been provided with reference to FIGS. 1, 2A, and 2B, further descriptions will be omitted.

Figure 5A:
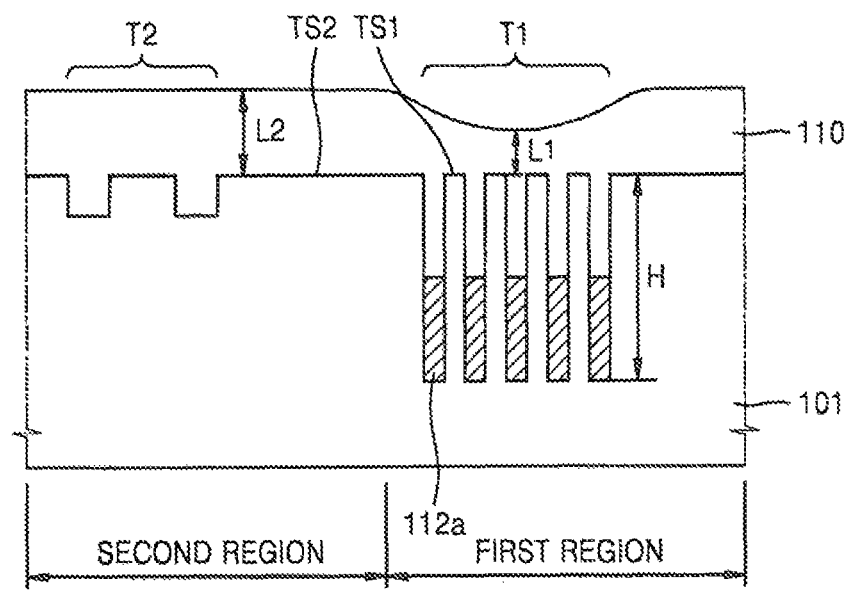
FIGS. 5A to 5G are cross-sectional views illustrating intermediate structures provided in operations of a method of forming a hardmask material film, according to some embodiments of the inventive concept.

Referring to FIGS. 4 and 5A, the first hardmask material film 110 of the first region may be partially (i.e., selectively) cured (Block 300). Only a portion of the first hardmask material film 110 between the first topology patterns T1 may be selectively cured as illustrated in FIG. 5A.

In some embodiments, an entire portion of the first hardmask material film 110 between the first topology patterns T1 may be cured as illustrated in FIG. 2C. In some embodiment, only a portion of the first hardmask material film 110 adjacent a bottom of the space between the first topology patterns T1 may be cured as illustrated in FIG. 5A.

As a result, a cured first hardmask material film 112a may be disposed in a lower portion of the first topology patterns T1 (i.e., adjacent the bottom of the space between the first topology patterns T1). When the first topology patterns T1 are holes, the cured first hardmask material, film 112a may be disposed on a bottom of the holes.

In addition, a level L1 of a free surface of the first hardmask material film 110 in the first region may be different from a level L2 of a free surface of the first hardmask material film 110 in the second region. A difference (L2−L1) between the two levels may be several hundred angstroms. Due to such a level difference, an exposure process may be optically unsatisfactorily performed in a subsequent photolithography process.

Figure 5B:
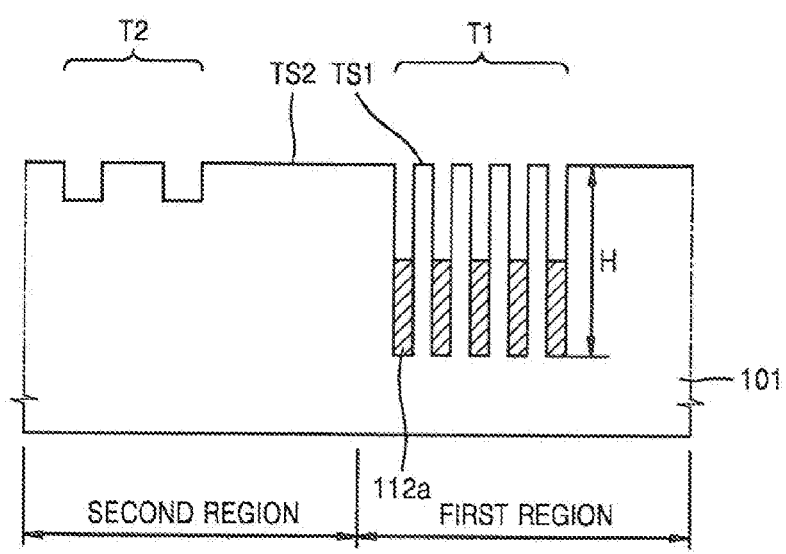

Referring to FIGS. 4 and 5B, the non-cured first hardmask material film 110 may be removed from the first region and the second region (Block 400). The non-cured first hardmask material film 110 may be rinsed and then removed from the first region and the second region. The non-cured first hardmask material film 110 may be removed by a solvent. Since the removing of the non-cured first hardmask material film 110 has been described above in detail with reference to FIG. 2D, a detailed description thereof will be omitted.

The cured first hardmask material film 112a may remain in spaces between the first topology patterns T1.

As described above, the non-cured first hardmask material film 110 may be removed through two operations while varying the rotational speed of the substrate 101. Since the removing of the non-cured first hardmask material film 110 has been described above in detail, a further description thereof will be omitted.

Figure 5C:
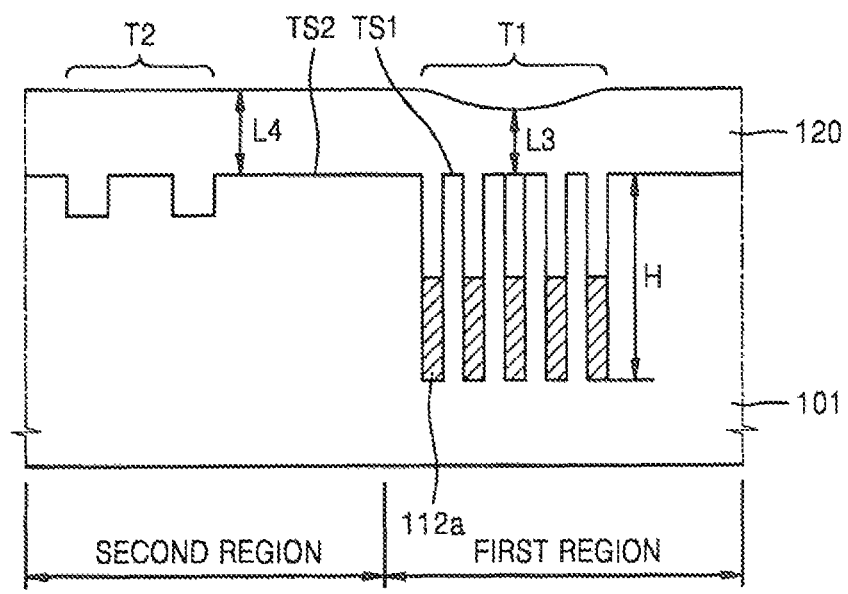

Referring to FIGS. 4 and 5C, a second hardmask material film 120 may be formed in the first region and the second region. The second hardmask material film 120 may include substantially the same material as the first hardmask material film 110. In some embodiments, the second hardmask material film 120 may include a different material from the first hardmask material film 110.

The second hardmask material film 120 may be formed by using a dip coating process, a solution casting process, or a spin coating process. However, the inventive concept is not limited thereto.

When the second hardmask material film 120 is formed on the first region and the second region, the second hardmask material film 120 may be formed in a space that is defined between the first topology patterns T1 and is not filled with the cured first hardmask material film 112a. In some embodiments, the second hardmask material film 120 may fill the space. The space may be filled by a capillary phenomenon caused by a narrow gap between the first topology patterns T1.

After the second hardmask material film 120 is formed in the space between the first topology patterns T1, a slight level difference between upper surfaces of the second hardmask material film 120 may still exist. More specifically, a level difference (L4−L3) may still exist between a level L3 of a free surface of the second hardmask material film 120 in the first region and a level L4 of a free surface of the second hardmask material film 120 in the second region. Due to such a level difference (L4−L3), a smooth exposure process may be obstructed.

The level difference (L4−L3) may be smaller than the level difference (L2−L1) described with reference to FIG. 5A.

Figure 5D:
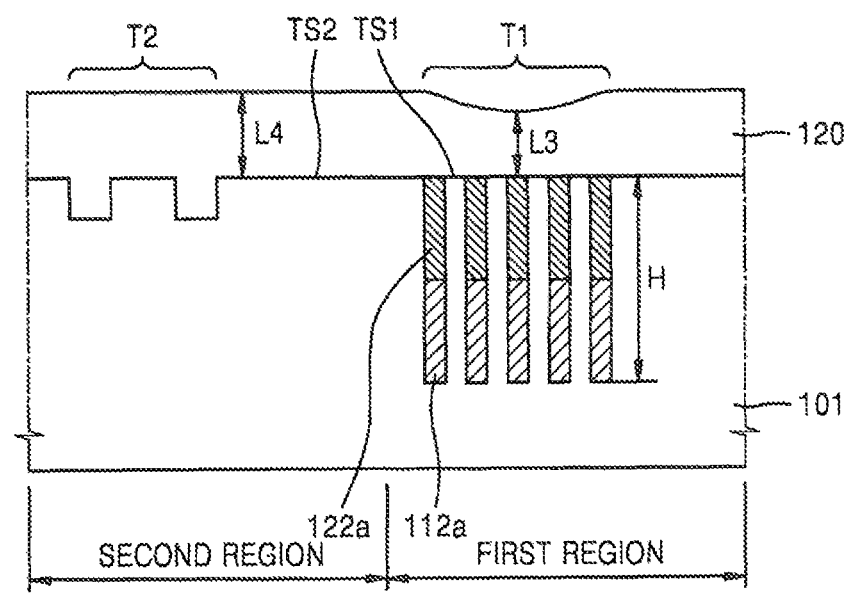

Referring to FIGS. 4 and 5d, the second hardmask material film 120 of the first region may be partially (i.e., selectively) cured (Block 600). Only portions of the second hardmask material film 120 in spaces between the first topology patterns T1 may be partially (i.e., selectively) cured as illustrated in FIG. 5D.

A cured second hardmask material film 122a may be formed to come into direct contact with the cured first hardmask material film 112a.

In order to partially cure the second hardmask material film 120, energy may be applied to the second hardmask material film 120. In some embodiments, the energy may be thermal energy. The thermal energy may be transferred from a lower side of the substrate 101 to the second hardmask material film 120 through the substrate 101. Since is the applying of the energy has been described in detail with reference to FIGS. 2C and 3, a further description thereof will be omitted.

Figure 5E:
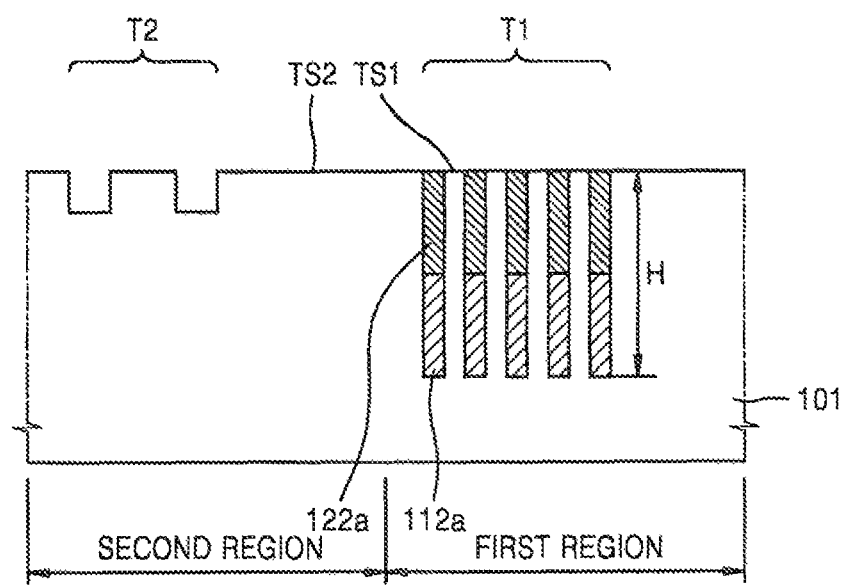

Referring to FIGS. 4 and 5E, the non-cured second hardmask material film 120 may be removed from the first region and the second region (Block 700).

A process of removing the non-cured second hardmask material film 120 may be performed in substantially the same manner as the process of removing the non-cured first hardmask material film 110. Since is the process of removing the non-cured first hardmask material film 110 has been described in detail with reference to FIG. 5B, a further description thereof will be omitted.

When the non-cured second hardmask material film 120 is removed, the surface of the cured second hardmask material film 122a may be exposed. An upper surface of the cured second hardmask material film 122a may be substantially coplanar with the upper surfaces TS1 and TS2 of the substrate 101. However, in some embodiments, the upper surface of the cured second hardmask material film 122a may slightly protrude upward from the upper surfaces TS1 and TS2 of the substrate 101. In some embodiments, the upper surface of the cured second hardmask material film 122a may be slightly recessed downward, as compared to the upper surfaces TS1 and TS2 of the substrate 101.

Figure 5F:
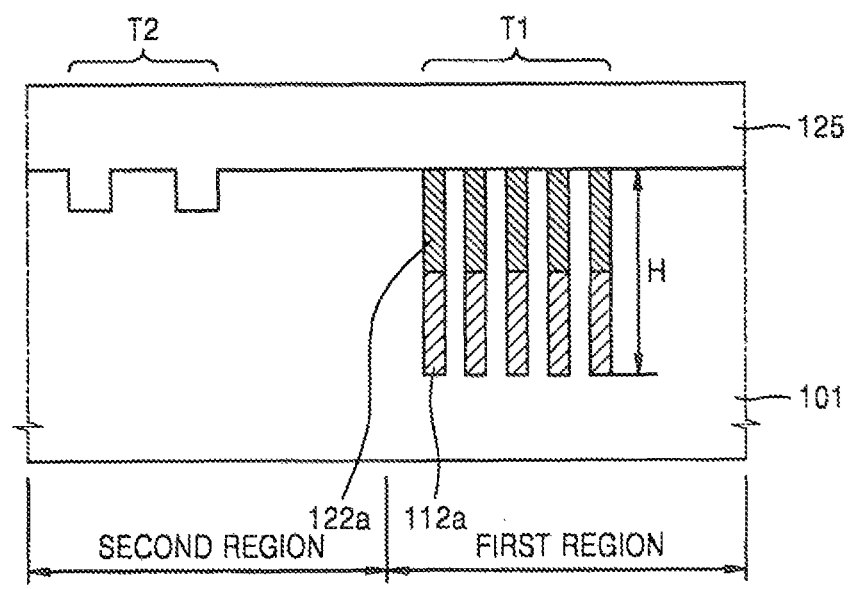

Referring to FIGS. 4 and 5F, a third hardmask material film 125 may be formed in the first region and the second region.

The third hardmask material film 125 may be substantially the same material film as the first hardmask material film 110 and/or the second hardmask material film 120. In some embodiments, the third hardmask material film 125 may be a different material film from the first hardmask material film 110 and the second hardmask material film 120.

Immediately before the third hardmask material film 125 is formed, the first topology patterns T1 are buried by the cured first and second hardmask material films 112a and 122a. Hence, when the third hardmask material film 125 is formed, it is possible to significantly reduce or possibly prevent the occurrence of the phenomenon that a free surface of the third hardmask material film 125 sags downward in the vicinity of the first topology patterns T1. Therefore, it is possible to significantly reduce or possibly eliminate a level difference between the upper surfaces of the third hardmask material film 125 in the first region and the second region, thus obtaining a flat upper surface thereof.

The processes described above with reference to FIGS. 5A to 5F may be continuously performed within the same chamber, without unloading the substrate 101 to the outside of the chamber. In this case, the unloading of the substrate 101 may be maximally reduced, thus minimizing unnecessary contamination, in addition, the time to transfer the substrate 101 between the chambers may be reduced, thus improving productivity.

Figure 5G:
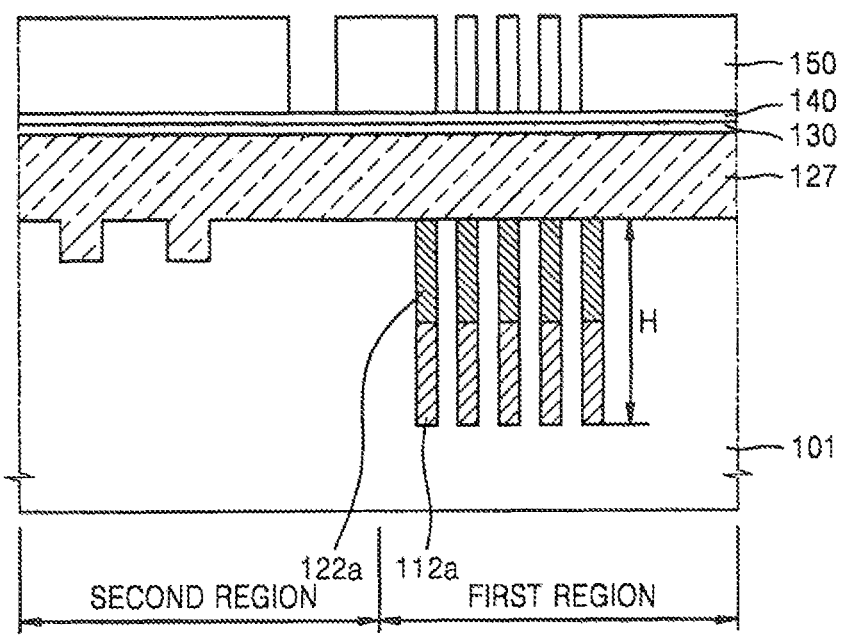

Referring to FIG. 5G, the third hardmask material film 125 may be cured to obtain a cured third hardmask material film 127.

As described above with reference to FIG. 2F, a silicon oxynitride film 130 and an anti-reflection film 140 may be formed on the cured third hardmask material film 127. In addition, photoresist patterns 150 may be formed on the anti-reflection film 140.

It will be understood by one of ordinary skill in the art that the hardmask patterns may be obtained by transferring the photoresist patterns 150 onto the cured third hardmask material film 127. In addition, it will be understood by one of ordinary skill in the art that the substrate 101 may be etched by using the hardmask patterns onto which the photoresist patterns 150 are transferred.

Figure 6A:
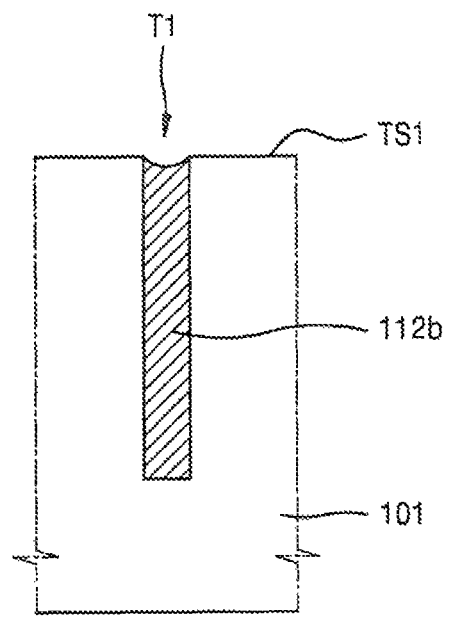
FIGS. 6A and 6B are cross-sectional views of a cured first hardmask material film remaining in first topology patterns.
Figure 6B:
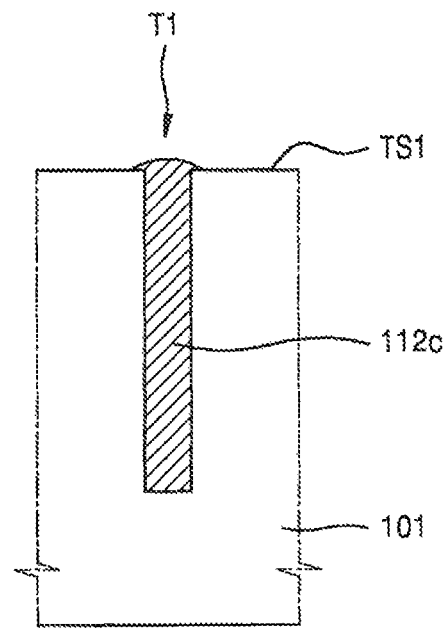

FIGS. 6A and 6B are cross-sectional views illustrating a cured first hardmask material film 112b remaining in the first topology patterns T1.

Referring to FIG. 6A, the cured first hardmask material film 112b may remain in the recess between the first topology patterns T1 formed in the substrate 101. An upper surface of the first hardmask material film 112b may be concavely formed toward the inside of the first topology patterns T1.

Referring to FIG. 6B, a cured first hardmask material film 112e may remain in the recess between the first topology patterns T1 formed in the substrate 101. An upper surface of the first hardmask material film 112e may be convexly formed toward the outside of the first topology patterns T1. In addition, the first hardmask material film 112c may remain to cover a portion of the upper surface TS1 adjacent to an opening of the recess between the first topology patterns T1.

The upper surface of the first hardmask material film 112b and 112c may be substantially coplanar with the upper surface TS1 of the first region, but may be formed concavely or convexly as illustrated in FIGS. 6A and 6B. As described above, a manufacturing condition for forming the upper surface of the first hardmask material film 112b and 112c concavely or convexly may be determined through simple repeated experiments.

FIGS. 7A to 7I are cross-sectional views illustrating intermediate structures provided in operations of a method of manufacturing a semiconductor device, according to some embodiments of the inventive concept.

Figure 7A:
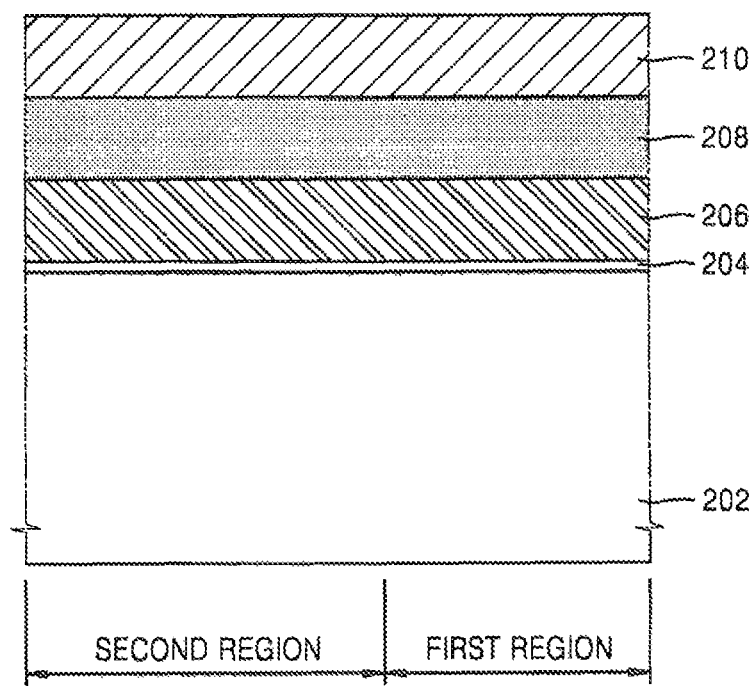
FIGS. 7A to 7I are cross-sectional views illustrating intermediate structures provided in operations of a method of manufacturing a semiconductor device, according to some embodiments of the inventive concept.

Referring to FIG. 7A, a semiconductor substrate 202 including a first region and a second region may be provided. A voltage applied to a gate of a semiconductor device formed in the second region may be higher than to a voltage applied to a gate of a semiconductor device formed in the first region. For example, in the case of a flash memory device, the first region may be a memory cell region in which a memory cell is formed, and the second region may be a peripheral circuit region in which a peripheral circuit, such as a high voltage device (HVN), is formed so as to drive the memory cell. A width of a gate of the high voltage device formed in the second region may be wider than a width of a gate of the semiconductor device formed in the first region. In addition, a width of a device isolation region of the high voltage device formed in the second region may be wider than a width of a device isolation region of the semiconductor device formed in the first region.

A screen oxide may be formed on the semiconductor substrate 202. A well ion implantation process and a threshold voltage ion implantation process may be performed on the semiconductor substrate 202. The well ion implantation process may be performed so as to form a well region in the semiconductor substrate 202, and the threshold voltage ion implantation process may be performed so as to adjust a threshold voltage of a semiconductor device such as a transistor. The screen oxide may reduce or possibly prevent damages on the surface of the semiconductor substrate 202 during the well ion implantation process or the threshold voltage ion implantation process.

The screen oxide may be removed and a gate insulating film 204 may be formed on the semiconductor substrate 202. The gate insulating film 204 may be an oxide film. For example, in a process of manufacturing a flash memory device, the gate insulating film 204 formed in the first region may be a tunnel insulating film of the flash memory device. The tunnel insulating film may allow the tunnelling of electrons according to Fowler/Nordheim tunnelling. Although not illustrated, the gate insulating film 204 formed in the second region may be thicker than the gate insulating film 204 formed in the first region.

A gate conductive film 206 may be formed on the gate insulating film 204. The gate conductive film 206 may be a polysilicon film. For example, in the process of manufacturing the flash memory device, the gate conductive film 206 may be a conductive film for a floating gate of the flash memory device. In this case, the gate conductive film 206 may store or discharge charges. Therefore, in a program operation, electrons existing in a channel region of the semiconductor substrate 202 may pass through the gate insulating film 204 and be then accumulated in the gate conductive film 206. In an erase operation, the electrons stored in the gate conductive film 206 may pass through the gate insulating film 204 and be then discharged to the semiconductor substrate 202.

A hardmask film 208 to be used in a gate etching process may be formed on the gate conductive film 206. The hardmask film 208 may include a material film having a different etch selectivity from the gate conductive film 206. For example, the hardmask film 208 may be a nitride film. A buffer film may be further formed between the gate conductive film 206 and the hardmask film 208. For example, the buffer film may be an oxide film.

A first photoresist film 210 may be formed on the hardmask film 208. An ArF photoresist film may be used as the first photoresist film 210 so as to suitably limit a device isolation region of the first region which has a narrow width as compared to a width of a device isolation region of the second region.

Figure 7B:
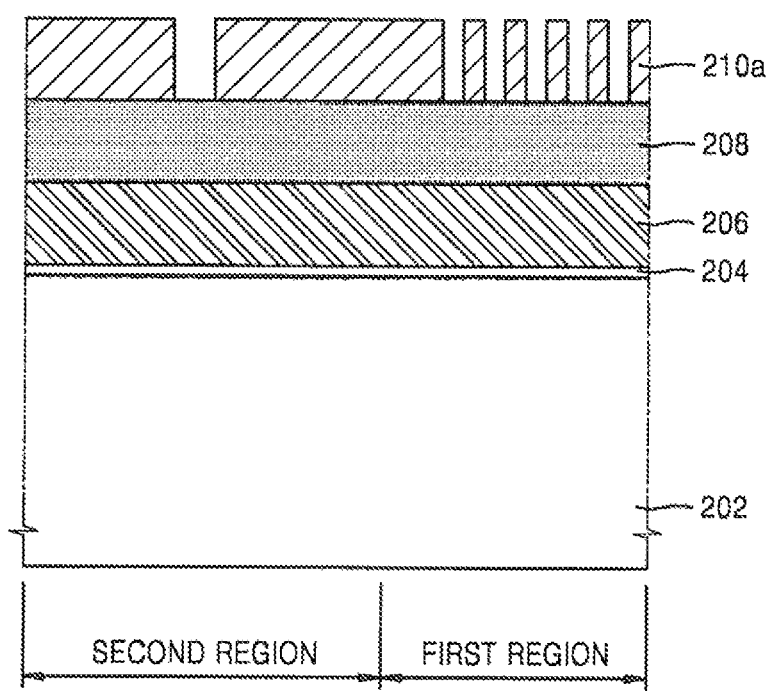

Referring to FIG. 7B, an exposure process and a development process may be performed on the first photoresist film 210 to form first photoresist patterns 210a. The first photoresist patterns 210a may be formed to open an upper portion of the device isolation region in the first region and an upper portion of the device isolation region in the second region. In particular, an opened width of the upper portion of the device isolation region in the second region may be narrower than a width of the device isolation region in the second region.

Figure 7C:
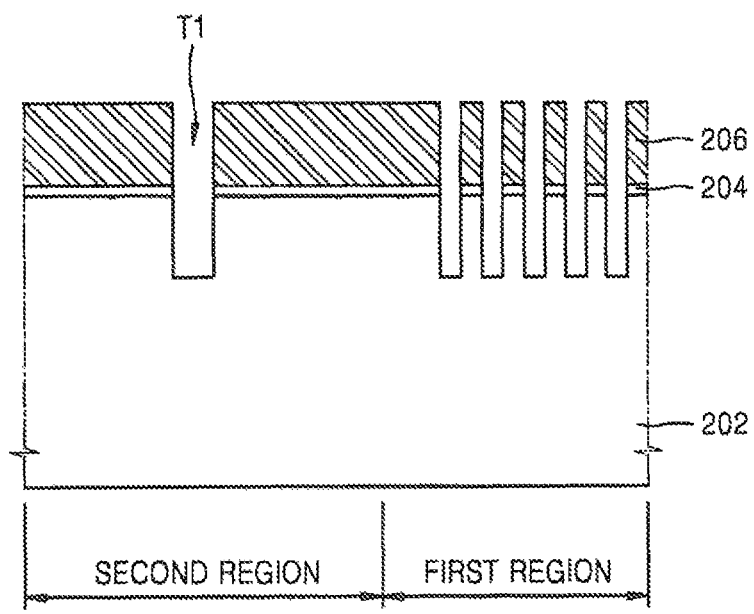

Referring to FIG. 7C, the hardmask film 208 formed on the device isolation regions of the first and second regions may be etched through an etching process using the first photoresist patterns 210a. Patterns may be formed by etching the gate conductive film 206 and the gate insulating film 204 by using the hardmask film 208, and a trench may be formed by etching a portion of the semiconductor substrate 202. Accordingly, a gate pattern may be formed in the first region while the trench is formed by etching the upper portion of the device isolation region. In addition, a first trench T1, a width of which is narrower than a width of the device isolation region, may be formed in the second region.

The first photoresist patterns 210a may be removed immediately after the hardmask film 208 is etched, or may be removed after the first trench T1 is formed by etching a portion of the semiconductor substrate 202. The first photoresist patterns 210a may be removed by a photoresist strip process.

The hardmask film 208 also may be removed. The hardmask film 208 may be removed by an ashing process.

Figure 7D:
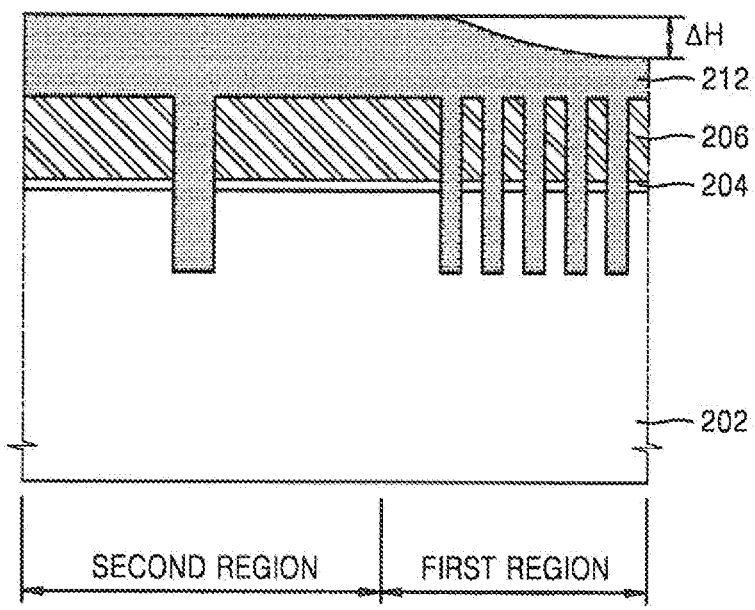

Referring to FIG. 7D, a hardmask material film 212 may be formed on the surfaces of the first and second regions. For example, the hardmask material film 212 may be formed by a spin coating process. Upper surfaces of the hardmask material film 212 in the first region and the second region may be uneven (e.g., not flat). For example, a level difference ΔH between the upper surfaces of the hardmask material film 212 in the first region and the second region may be several hundred angstroms.

Figure 7E:
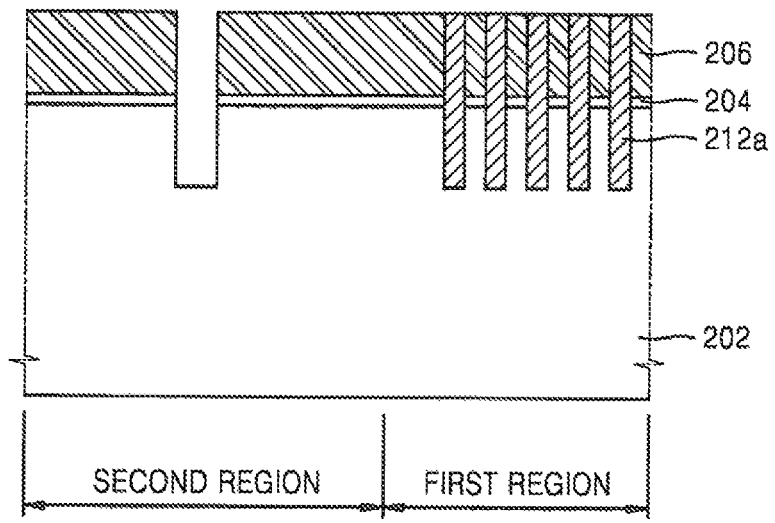

Referring to FIG. 7E, the hardmask material film 212 inside the device isolation region of the first region may be selectively cured, and a non-cured hardmask material film 212 may be removed by a rinse process. Although recesses exist in the second region, the recesses existing in the second region are less dense than the recesses existing in the first region. Thus, the hardmask material film 212 formed inside the recesses in the second region may not be cured or may be slightly cured. As a result, the hardmask material film 212 inside of the recesses in the second region may be clearly washed out in a process of rinsing the non-cured hardmask material film 212.

In addition, the cured hardmask material film 212a may remain in a state of filling the device isolation region of the first region.

Figure 7F:
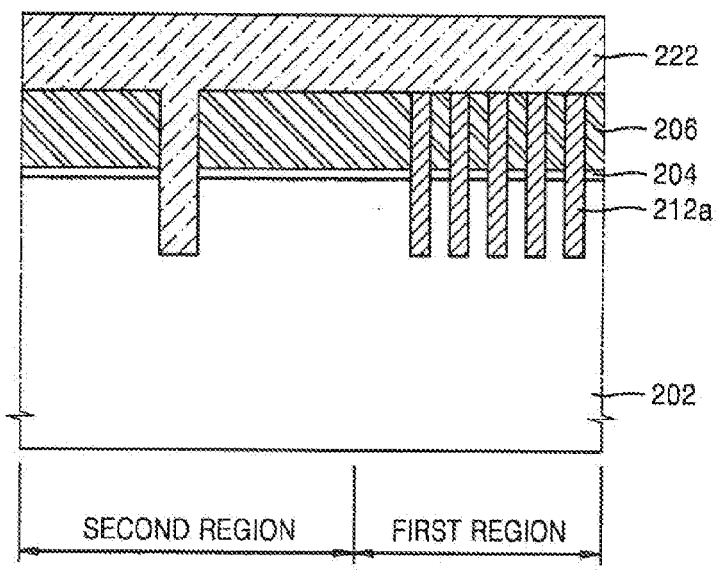
Figure 7G:
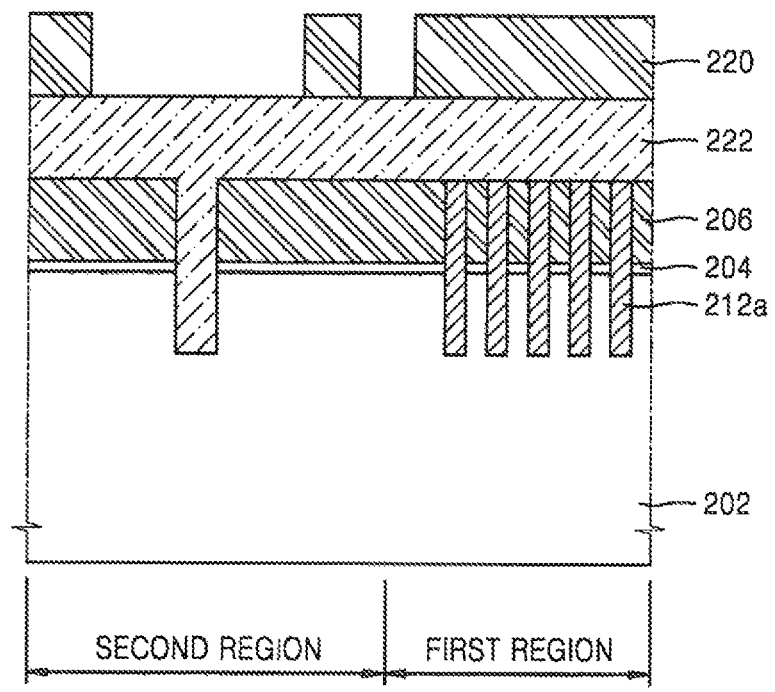

Referring to FIG. 7F, a hardmask material film may be applied again on the upper surfaces of the first and second regions. The hardmask material film may be formed by a spin coating process. Since the device isolation region of the first region is buried by the hardmask material film 212a, the hardmask material film may improve the flatness of the upper surfaces of the first and second regions. Therefore, the hardmask material film may be precisely patterned through a subsequent photolithography process.

The hardmask material film may be cured to obtain a hardmask film 222.

Referring to 7G, a second photoresist film may be formed on the hardmask film 222. The second photoresist film may be an ArF photoresist film so as to suitably limit the device isolation region of the second region which is wider than the device isolation region of the first region.

In addition, an exposure process and an etching process may be performed on the second photoresist film to form second photoresist patterns 220. The second photoresist patterns 220 may be formed to open only the upper portion of the device isolation region in the second region. Accordingly, an upper portion of the first trench T1 also may be exposed.

Figure 7H:
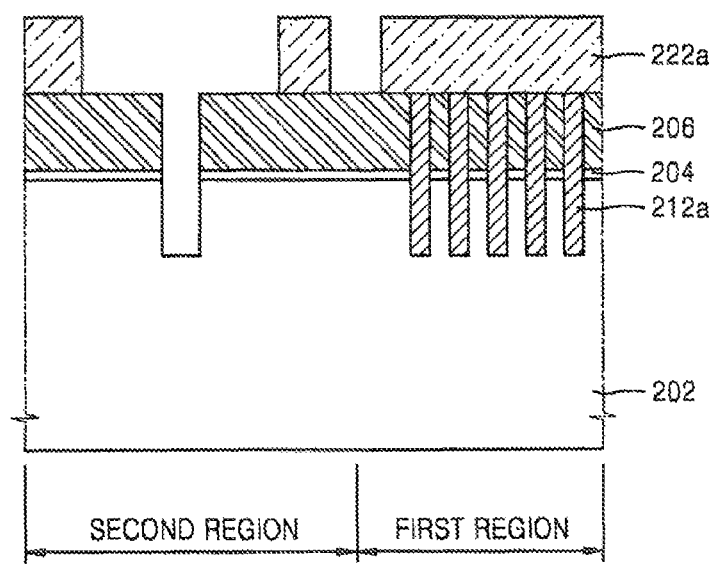

Referring FIG. 7H, hardmask patterns 222a may be formed by patterning the hardmask film 222 by using the second photoresist patterns 220 as an etching mask.

Figure 7I:
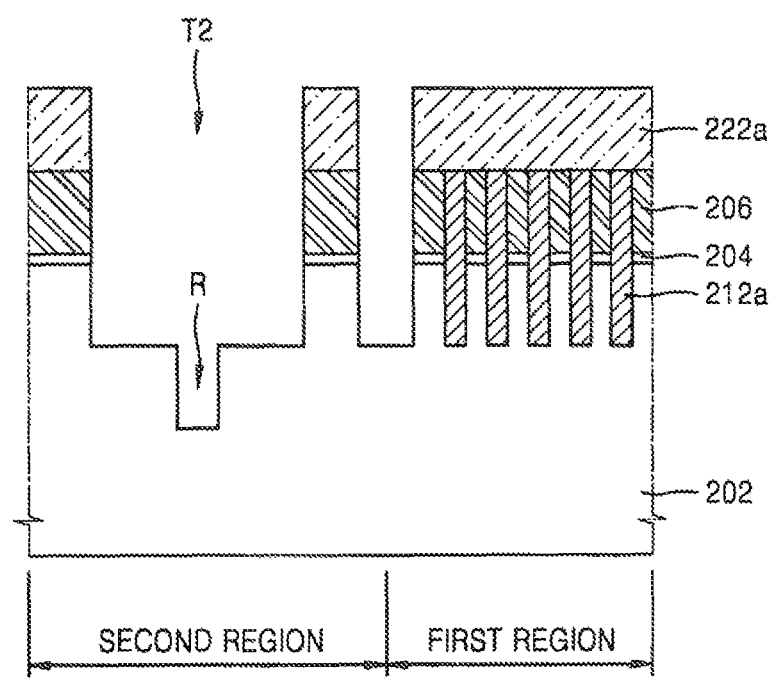

Referring to FIG. 7I, patterns may be formed by etching the gate conductive film 206 and the gate insulating film 204 on the device isolation region of the second region by using the hardmask patterns 222a, and a second trench T2 may be formed by etching a portion of the semiconductor substrate 202. An upper width of the second trench T2 may be wider than a width of the first trench 11 and may correspond to a width of the device isolation region. A recess R may be formed in a lower portion of the second trench T2 by further etching the first trench T1.

Since the recess R increases a distance between channel regions of the adjacent high voltage devices by a depth of the recess R and a width of the second trench T2, it may be possible to prevent a leakage current from occurring in the high voltage device.

Figure 8:
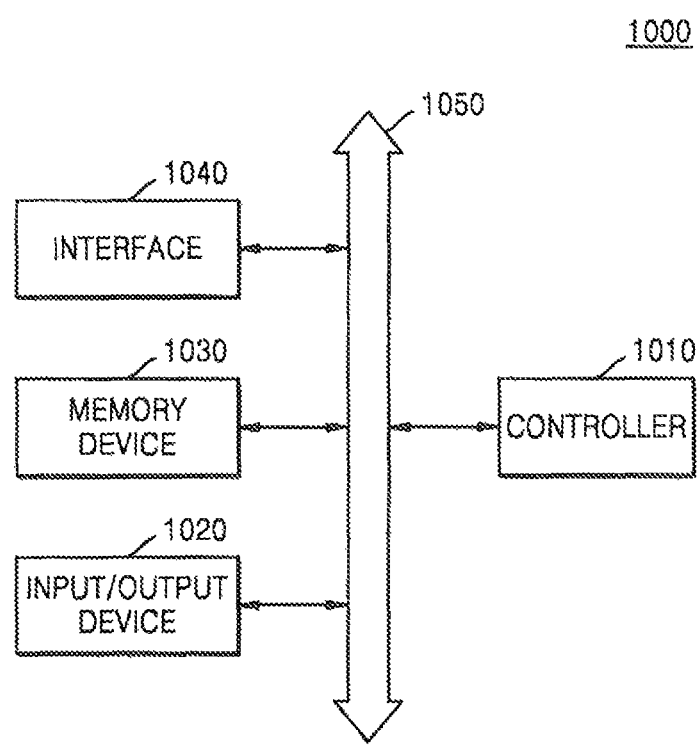
FIG. 8 is a block diagram of a system including an integrated circuit device, according to some embodiments of the inventive concept.

FIG. 8 is a block diagram of a system 1000 including an integrated circuit device, according to some embodiments of the inventive concept.

Referring to FIG. 8, the system 1000 may include a controller 1010, an input/output device 1020, a memory device 1030, and an interface 1040. The system 1000 may be a mobile system or an information transmitting/receiving system. In some embodiments, the mobile system may be a personal digital assistant (FDA), a portable computer, a web tablet, a wireless phone, a mobile phone, a digital music player, or a memory card. The controller 1010 may control a program that is executed on the system 1000. The controller 1010 may include a microprocessor, a digital signal processor, a microcontroller, and other similar devices. The input/output device 1020 may input and output data in the system 1000. The system 1000 may be connected to an external device, such as a personal computer or a network, by using the input/output device 1020, and may exchange data with the external device. The input/output device 1020 may be a keypad, a keyboard, or a display.

The memory device 1030 may store codes and/or data for operating the controller 1010 or store data processed by the controller 1010. The memory device 1030 may include at least one integrated circuit device that is manufactured by a method of forming the material film or a method of manufacturing the integrated circuit device according to some embodiments of the inventive concept. For example, the memory device 1030 may include at least one integrated circuit device that is manufactured by the method of forming the material film as described with reference to FIGS. 2A to 2H, or the method of manufacturing the integrated circuit device as described with reference to FIGS. 7A to 7I.

The interface 1040 may be a data transmission path between the system 1000 and external devices. The controller 1010, the input/output device 1020, the memory device 1030, and the interface 1040 may communicate with one another via a bus 1050. The system 1000 may be used in a mobile phone, an MP3 player, a navigation device, a portable multimedia player (PMP), a solid state disk (SSD), or household appliances.

Figure 9:
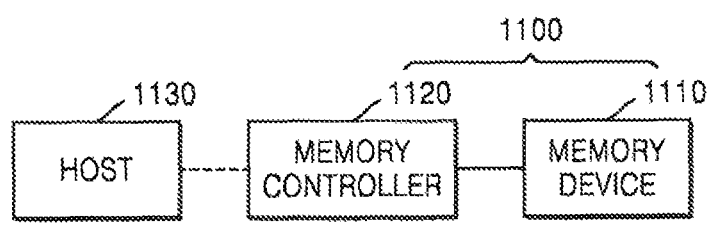
FIG. 9 is a block diagram of a memory card including an integrated circuit device, according to some embodiments of the inventive concept.

FIG. 9 is a block diagram of a memory card 1100 including an integrated circuit device, according to some embodiments of the inventive concept.

The memory card 1100 may include a memory device 1110 and a memory controller 1120.

The memory device 1110 may store data, in some embodiments, the memory device 1110 may have non-volatile characteristics capable of retaining stored data even when power is cut off. The memory device 1110 may include at least one integrated circuit device that is manufactured by a method of forming the material film or the methods of manufacturing the integrated circuit device according to some embodiments of the inventive concept. For example, the memory device 1110 may include at least one integrated circuit device that is manufactured by the methods of forming the material film as described with reference to FIGS. 2A to 2H or FIGS. 5A to 5G, or the method of manufacturing the integrated circuit device as described with reference to FIGS. 7A to 7I.

The memory controller 1120 may read data from the memory device 1110 or store data in the memory device 1110 in response to a read/write request from a host 1130. The memory controller 1120 may include at least one integrated circuit device that is manufactured by a manufacturing method according to some embodiments of the inventive concept. For example, the memory controller 1120 may include at least one integrated circuit device that is manufactured the methods of forming the material film as described with reference to FIGS. 2A to 2H or FIGS. 5A to 5G, or the method of manufacturing the integrated circuit device as described with reference to FIGS. 7A to 7I.

As described above, according to some embodiments of the inventive concept, it is possible to obtain a hardmask film with considerably improved flatness without additional contamination and to manufacture integrated circuit devices with high-precision.

While the inventive concept has been particularly shown and described with reference to example embodiments thereof, it will be understood that various changes in form and details may be made therein without departing from the spirit and scope of the following claims.

What is claimed is:

1. A method of forming a hardmask material film, the method comprising:
    preparing a substrate including a first region that includes first patterns with a first density and a second region that includes second patterns with a second density that is lower than the first density or is free of patterns;
    forming a first hardmask material film in gaps between the first patterns and on surfaces of the first region and the second region, the first hardmask material film comprising first portions in the gaps, respectively, and second portions outside the gaps;
    performing a heat treatment to the first hardmask material film;
    after performing the heat treatment, performing a rinse process using a solvent to remove the second portions of the first hardmask material film while at least some of the first portions of the first hardmask material film remain in the gaps, wherein solubility of the first portions of the first hardmask material film in the solvent becomes lower than solubility of the second portions of the first hardmask material film in the solvent by the heat treatment; and
    forming a second hardmask material film on the surfaces of the first region and the second region.

2. The method of claim 1, wherein during the heat treatment, heat is transferred to the first hardmask material film through the substrate.

3. The method of claim 2, wherein during the heat treatment, a heat source configured to apply heat to the substrate is disposed on an opposite side of the first hardmask material film with respect to the substrate.

4. The method of claim 3, wherein, after performing the heat treatment, the first portions of the first hardmask material film in the gaps between the first patterns are cured, and the second portions of the first hardmask material film outside the gaps between the first patterns are not cured.

5. The method of claim 1, wherein the first hardmask material film and the second hardmask material film are substantially a same material film.

6. The method of claim 1, wherein an upper surface of the second hardmask material film in the first region and an upper surface of the second hardmask material film in the second region are substantially coplanar.

7. The method of claim 6, wherein before the heat treatment is performed, an upper surface of the first hardmask material film in the first region and an upper surface of the first hardmask material film in the second region are not coplanar.

8. The method of claim 1, wherein the first hardmask material film comprises monomers, and wherein performing the heat treatment comprises polymerizing the monomers of the first portions of the first hardmask material film in the gaps between the first patterns.

9. A method of forming a hardmask material film, the method comprising:
preparing a substrate including a first region that includes recesses and a second region that comprises an upper surface that is flat and substantially coplanar with an upper surface of the first region;
forming a first hardmask material film in the recesses of the first region and on the upper surfaces of the first region and the second region such that a free surface of the first hardmask material film in the second region is higher than a free surface of the first hardmask material film in the first region, wherein the first hardmask material film comprises first portions in the recesses, respectively, and second portions on the upper surfaces of the first region and the second region;
curing the first portions of the first hardmask material film;
performing a rinse process using a solvent to remove the second portions of the first hardmask material film while at least some of the first portions of the first hardmask material film remain in the recesses; and
forming a second hardmask material film on the upper surfaces of the first region and the second region, wherein a height difference between free surfaces of the second hardmask material film in the first region and the second region is less than a height difference between the free surfaces of the first hardmask material film in the first region and the second region.

10. The method of claim 9, wherein curing the first portions of the first hardmask material film comprises applying heat to the first portions of the first hardmask material film.

11. The method of claim 9, wherein performing the rinse process comprises:
performing a first removal operation comprising dissolving and removing the second portions of the first hardmask material film by applying the solvent; and
performing a second removal operation comprising removing a residue remaining on the first hardmask material film,
wherein the first removal operation and the second removal operation are performed while rotating the substrate, and a rotational speed of the second removal operation is faster than a rotational speed of the first removal operation.

12. The method of claim 9, wherein the height difference between the free surfaces of the second hardmask material film in the first region and the second region is about 50 Å or less.

13. The method of claim 9, wherein the rinse process is performed until the upper surface of the second region is exposed.

14. A method of forming a mask layer comprising:
forming a first mask material on a substrate, a surface of the substrate including recesses and the first mask material being formed in the recesses;
selectively curing the first mask material in the recesses to form cured portions of the first mask material in the recesses;
removing non-cured portions of the first mask material from the substrate; and
forming a second mask material on the surface of the substrate that includes the cured portions of the first mask material.

15. The method of claim 14, wherein the surface of the substrate is a first surface, and the substrate includes a second surface opposite the first surface, and
wherein selectively curing the first mask material comprises applying heat to the second surface of the substrate.

16. The method of claim 14, wherein removing the non-cured portions of the first mask material comprises performing a rinse process using a solvent.

17. The method of claim 16, wherein the cured portions of the first mask material and the non-cured portions of the first mask material have different solubility in the solvent.

18. The method of claim 16, wherein removing the non-cured portions of the first mask material comprises performing the rinse process until the surface of the substrate is exposed.

19. The method of claim 14, wherein the non-cured portions of the first mask material comprise a portion in a liquid state after selectively curing the first mask material in the recesses.

20. The method of claim 14, wherein the first mask material comprises monomers, and
wherein selectively curing the first mask material in the recesses comprises polymerizing the monomers.

* * * * *